(12) United States Patent
Urbanek

(10) Patent No.: US 7,015,117 B2
(45) Date of Patent: Mar. 21, 2006

(54) METHODS OF PROCESSING OF GALLIUM NITRIDE

(75) Inventor: Wolfram Urbanek, San Jose, CA (US)

(73) Assignee: Allegis Technologies, Inc., Cupertino, CA (US)

( * ) Notice: Subject to any disclaimer, the term of this patent is extended or adjusted under 35 U.S.C. 154(b) by 0 days.

(21) Appl. No.: 10/892,525

(22) Filed: Jul. 14, 2004

(65) Prior Publication Data

US 2005/0042845 A1  Feb. 24, 2005

Related U.S. Application Data

(60) Provisional application No. 60/492,720, filed on Aug. 4, 2003, provisional application No. 60/492,713, filed on Aug. 4, 2003, provisional application No. 60/489,350, filed on Jul. 22, 2003, provisional application No. 60/487,896, filed on Jul. 14, 2003, provisional application No. 60/487,417, filed on Jul. 14, 2003.

(51) Int. Cl.
*H01L 21/00* (2006.01)

(52) U.S. Cl. .................. 438/458; 438/455; 438/492

(58) Field of Classification Search ............ 438/458, 438/455, 492, 498, 795
See application file for complete search history.

(56) References Cited

U.S. PATENT DOCUMENTS

| | | | |
|---|---|---|---|
| 6,071,795 A * | 6/2000 | Cheung et al. ............. 438/458 |
| 6,113,685 A * | 9/2000 | Wang et al. ................... 117/3 |
| 6,261,931 B1 * | 7/2001 | Keller et al. ................. 438/492 |
| 6,335,263 B1 * | 1/2002 | Cheung et al. ............. 438/455 |
| 6,344,404 B1 | 2/2002 | Cheung et al. ............. 438/513 |
| 6,365,429 B1 | 4/2002 | Kneissel et al. .............. 438/46 |
| 6,420,242 B1 * | 7/2002 | Cheung et al. ............. 438/458 |
| 6,448,102 B1 | 9/2002 | Kneissl et al. ................ 438/46 |
| 6,559,075 B1 | 5/2003 | Kelly et al. ................. 438/795 |
| 6,740,604 B1 | 5/2004 | Kelly et al. ................. 438/795 |
| 6,744,196 B1 | 6/2004 | Jeon ........................... 313/498 |
| 6,794,276 B1 * | 9/2004 | Letertre et al. ............. 438/506 |
| 2004/0029359 A1 * | 2/2004 | Letertre et al. ............. 438/458 |
| 2005/0026394 A1 * | 2/2005 | Letertre et al. ............. 438/459 |

* cited by examiner

*Primary Examiner*—Laura M. Schillinger
(74) *Attorney, Agent, or Firm*—David H. Jaffer; Pillsbury Winthrop Shaw Pittman LLP

(57) ABSTRACT

A method for improving thermal dissipation in large gallium nitride light emitting diodes includes replacing sapphire with a better thermal conductor resulting in more efficient removal of thermal energy. A method for achieving a reliable and strong temporary bond between a GaN epitaxial layer and a support wafer. A method for transferring an epitaxial film from a growth substrate to a secondary substrate. An excimer laser initiates film delamination from the growth substrate. The laser beam is shaped by a shadow mask and aligned to an existing pattern in the growth substrate. A method for fabricating a LED that radiates white spectrum light. A phosphor that radiates a white spectrum after excitation in the blue or UV spectrum onto the GaN epitaxial wafer prior to die separation and packaging. A method for depositing a metal substrate onto a GaN epitaxy layer.

2 Claims, 15 Drawing Sheets

METHODS OF PROCESSING OF GALLIUM NITRIDE

The present application claims priority from U.S. Provisional Patent Applications including the following Ser. Nos.: Ser. No. 60/492,720 filed Aug. 4, 2003; Ser. No. 60/489,350 filed Jul. 22, 2003; Ser. No. 60/487,896 filed Jul. 14, 2003; Ser. No. 60/492,713 filed Aug. 4, 2003; and Ser. No. 60/487,417 filed Jul. 14, 2003. The disclosure of these provisional applications is incorporated herein by reference.

BACKGROUND OF THE INVENTION

1. Field of the Invention

The present invention relates generally to the field of high power light emitting diodes, and epitaxial films, and more particularly to high power gallium nitride on sapphire light emitting diodes, and to the transfer of GaN films from a growth substrate to a secondary substrate, and to vertical gallium nitride and while gallium nitride diodes.

2. Description of the Prior Art

Gallium nitride (GaN) based light emitting diodes (LEDs) are an important source of solid state lighting in the UV through Green portion of the spectrum. Unlike other LED material systems (e.g., indium phosphide, gallium arsenide), GaN is generally grown on high quality sapphire ($Al_2O_3$) or silicon carbide (SiC) substrates, since high quality GaN wafers are not commercially available. SiC is much more expensive than sapphire, and it is difficult to obtain high quality GaN films on SiC due to lower SiC quality as compared to sapphire. Consequently, sapphire is the best commercial choice of GaN epitaxy substrate.

Unfortunately, sapphire is a poor thermal conductor. This presents difficulties in removing heat from the LED chip while it is in an operating state. The higher the electrical input current, the more heat is generated in the chip, and the hotter the chip becomes, due to the limited thermal conductance of the sapphire substrate. This problem is greatly exacerbated with increasing LED chip size, since these larger chips required much higher input currents to operate. In fact, inefficient heat sinking ability is one of the limiting factors in large area LED brightness. Chip temperature significantly affects the device lifetime and stability. This is especially true for blue or UV chips which use phosphors (e.g., YAG) for re-radiating white spectrum light.

Current state-of-the-art large area GaN LEDs rely on sophisticated packaging techniques, such as flip-chip bonding, to address heat removal issues. These packaging methods both increase costs and potentially reduce yields. Furthermore, with ever increasing chip size and input power, these techniques may not be sufficient in removing enough thermal energy from the LED chip to keep operating temperatures stable and low.

GaN is both thermally and electrically insulating, a non-desirable trait. It is therefore useful to replace the sapphire substrate with a secondary substrate that is thermally and electrically conducting (e.g., various metals).

A group at the University of California, Berkeley, has developed a method of removing a GaN film from sapphire by irradiating the GaN through the sapphire with a 248 nm KrF excimer laser. Due to the bandgap energy of sapphire relative to the wavelength of the laser, the laser beam will pass through the sapphire with minimal absorption. However, the bandgap energy of GaN is such that most of the laser beam is absorbed in the GaN film at the sapphire-GaN interface. This absorbed energy is sufficient to decompose the GaN into gallium (Ga) and nitrogen (N) in a very thin region at the sapphire-GaN interface. Since the melting point of Ga is 30° C., the post-irradiated GaN film can be removed from the sapphire by heating above 30° C.

While lower laser beam energy densities will decompose GaN, the energy densities required to achieve high quality post-delamination GaN films are generally above 600 mJ/cm$^2$. At such energy densities, the beam size is limited to approximately 2 cm$^2$ due to power limitations on commercially available lasers. Current state-of-the-art GaN is grown on 50 mm diameter sapphire wafers, although this technology is migrating to large wafers (75 mm, 100 mm). With a maximum laser beam size of 2 cm$^2$, a 50 mm GaN film would require more than 10 separate delamination cycles. Generally, the first delamination produces high quality films, but high stresses build up at the interface between delaminated and non-delaminated areas. These stresses can produce significant numbers of cracks in the GaN film during subsequent delamination cycles. Such cracks significantly decrease yields in subsequent processing of the GaN film.

One method of limiting the amount of cracking in the GaN layer during laser processing is to etch trenches into the GaN prior to laser processing, in order to provide some chip-to-chip isolation. If these trenches are not etched completely through the GaN, then the chip-to-chip isolation is not very effective, and cracks still propagate from chip to chip. If the trenches are etched completely through the GaN layer, then isolation is effective, but the support wafer bonding layer is exposed to the laser, thereby becoming weakened, leading to potential delamination of the support wafer prior to complete laser processing.

A white spectrum LED cannot be generated directly from GaN material, nor any other know semiconductor. The current method, therefore, for generating solid state white light consists of fabricating a blue or UV GaN LED chip and applying a variety of phosphors (e.g. Yitrium Aluminum Garnet—YAG) on top of the chip during packaging. The phosphor absorbs the blue or UV chip radiation, and re-radiates a white spectrum radiation.

The composition, thickness and uniformity of the phosphor layer are critical in determining the quality of the resulting white light, including such parameters as brightness, Color Rendering Index (CRI) and color temperature. This conventional approach of applying the phosphor during packaging significantly complicates the packaging process, and limits the use of solid state white light sources. Furthermore, over time the phosphor layer often interacts with the GaN chip, the wire bonds, or the epoxy used to encapsulate the LED package, resulting in degradation over time and reduced lifetimes.

GaN is generally grown on a very high quality sapphire ($Al_2O_3$) substrate, which is both thermally and electrically insulating, a non-desirable trait. It is therefore useful to replace the sapphire substrate with a secondary substrate that is thermally and electrically conducting (e.g., various metals).

A group at the University of California, Berkeley, has developed a method of removing a GaN film from sapphire by irradiating the GaN through the sapphire with a 248 nm KrF excimer laser. Prior to this laser lift off process, the Berkeley group permanently bonded a conducting wafer (namely Si) to the GaN side opposite the sapphire growth substrate (the p-doped surface of the GaN layer). This Si wafer provided support to the GaN layer during lift off, and took the role of conducting substrate after the lift off.

Generally, it is difficult to make good ohmic contact to the p-doped GaN layer, and the metallurgy available for such a contact is limited. Furthermore, in the Berkeley method described above, the metal layer bonding the Si wafer to the GaN layer has to be highly reflective as well for use in light emitting diode applications.

SUMMARY

Briefly, a preferred embodiment of the present invention includes a chip-level (as opposed to packaging level) solution to the GaN LED heat sink problem. This is accomplished by replacing the sapphire substrate, after the GaN film has been grown, with a thermally conducting substrate, such as various metals. A GaN film is epitaxially grown on a sapphire substrate. The film is then patterned, in a combination of film etching and metal and/or dielectric depositions. In one embodiment, the patterned GaN film is transferred from the sapphire substrate to an electrically conducting substrate. The phosphor layer is added either before or after the GaN film is transferred to the conducting substrate, but it is applied prior to chip separation (wafer dicing). In another embodiment, a support wafer (silicon, sapphire, metal, or other material) is either temporarily or permanently bonded to the GaN film using any variety of dissolvable or permanent adhesion layers (e.g., photoresist, wax, organic glue, metal solder). Alternately, the support wafer may be deposited via evaporation, sputtering, plating, or other deposition techniques. This support wafer may act as a mechanical support, an electrical contact to the epi, an optical path for the light emitting from the epi, or a combination of all three.

A laser beam of appropriate energy and wavelength is passed through a shadow mask before passing through the sapphire and becoming absorbed in the GaN at the sapphire-GaN interface. The shadow mask is aligned to the patterned GaN film in such a way that only specific, desired portions of the film are exposed to the laser radiation. After the entire GaN-on-sapphire wafer is exposed to the laser beam in this fashion, the wafer is heated, and the sapphire is removed from the GaN film, which is still supported by the support wafer.

After appropriate cleaning and conditioning of the newly exposed GaN surface, a secondary substrate (silicon, sapphire, metal, or other material) can be, but need not be, bonded to this GaN surface, replacing the removed sapphire wafer. Alternately, the secondary substrate may be deposited via evaporation, sputtering, plating, or other deposition techniques. This secondary substrate may act as a mechanical support, an electrical contact to the epi, an optical path for the light emitting from the epi, or a combination of all three. The support wafer can now be removed, if so desired.

In another embodiment, a GaN film is epitaxially grown on a sapphire substrate. The film is then patterned, in a combination of film etching and metal and/or dielectric depositions. A support wafer (silicon, sapphire, or other material) is temporarily bonded to the GaN film using any variety of dissolvable adhesion layers (e.g., photoresist, wax, organic glue). A laser beam of appropriate energy and wavelength is passed through the sapphire and absorbed in the GaN at the sapphire-GaN interface. After the entire GaN-on-sapphire wafer is exposed to the laser beam in this fashion, the wafer is heated, and the sapphire is removed from the GaN film, which is still supported by the support wafer. After appropriate cleaning and conditioning of the newly exposed GaN surface, a secondary substrate with desirable optical, electrical, and mechanical properties is now deposited onto this GaN surface, replacing the removed sapphire wafer. The support wafer can now be removed, if so desired.

IN THE DRAWINGS

DETAILED DESCRIPTION OF THE PREFERRED EMBODIMENTS

In one embodiment, GaN epitaxial films grown for LED applications consist of three main, sequentially grown layers (FIG. 1), each of which can be further subdivide into numerous additional layers. The main layers consist of a moderately conductive p-doped GaN layer (1), a light emitting InGaN quantum well (either single or multiple) layer (2), and a conductive n-doped GaN layer (3). Due to the rectifying nature of the GaN p-n junction, such a GaN film can only conduct electrical current from the p-layer (1), through the quantum well (QW) layer (2), into the n-layer (3), not in the other direction. Light will emit from the QW layer only if sufficient current is passed through it, as described above. Consequently, a GaN LED device requires a contact pad to both the n- and p-layers (1,3) through which to deliver this activating current.

Figure 2:
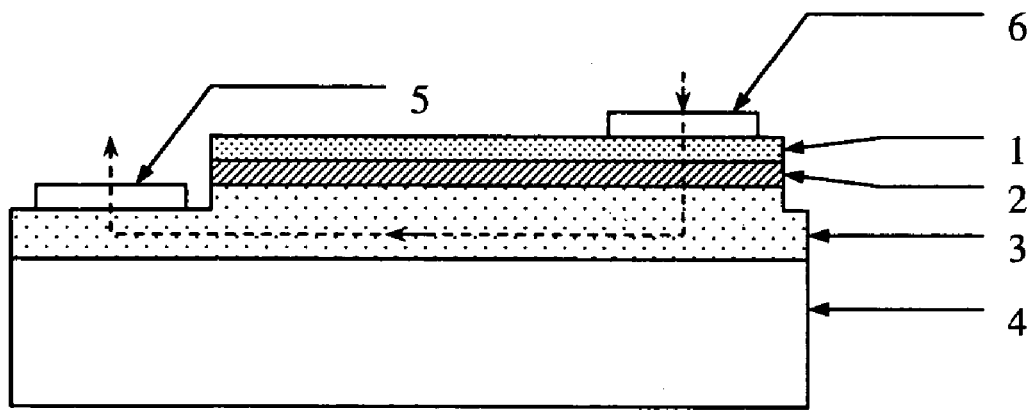
FIG. 2 illustrates a schematic of the conventional lateral GaN LED, illustrating the flow of electrical current through the device.

In the conventional GaN on sapphire LED (FIG. 2), some of the GaN must be removed to make contact to the n-layer (3) via the n-pad (5). This is the case because the sapphire (4) is not electrically conductive. The electrical current can now pass from the p-pad (6), into the p-layer (1), through the QW layer (2), through the n-layer (3), into the n-pad (5). Because the current runs laterally through the n-layer (3), this type of structure is called lateral.

In the lateral structure, the current flow is not optimal, and a condition known as current crowding will occur, particularly at higher currents. This will reduce the efficiency of the LED. Also, due to the poor thermal conductivity of the sapphire substrate (4), it is not simple to remove heat from the lateral LED. This will increase the chip temperature during operation, which can reduce stability and device lifetimes.

Figure 3A:
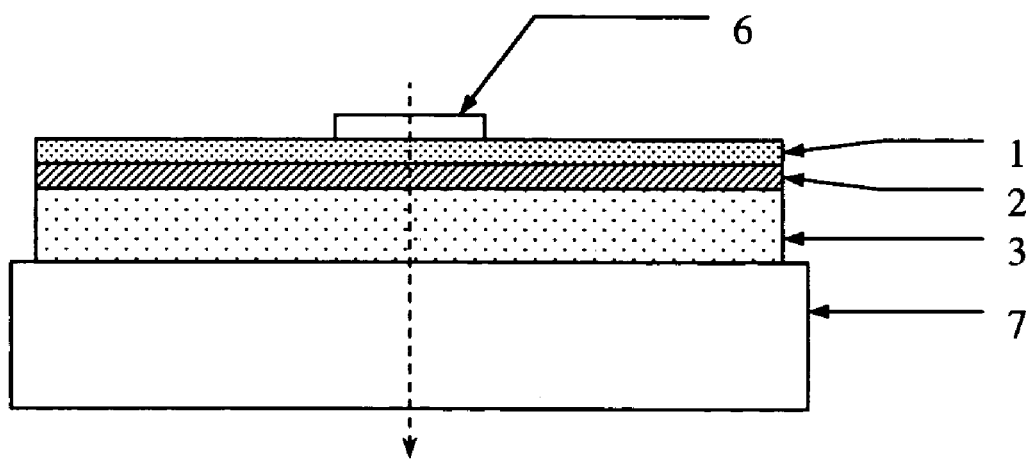
FIG. 3a illustrates a schematic of the vertical GaN LED embodied in the invention, illustrating the flow of electrical current through the device.
Figure 3B:
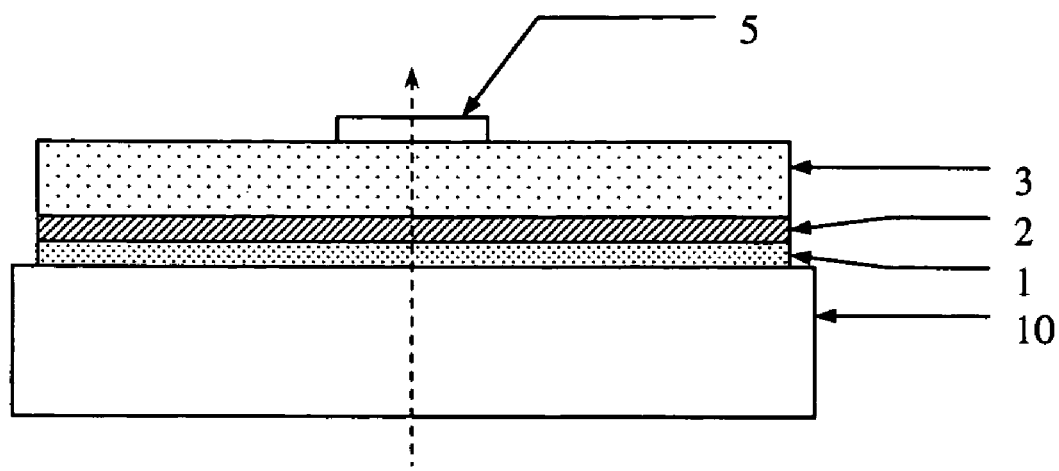
FIG. 3b illustrates a schematic of the vertical GaN LED in an alternate embodiment of the invention, illustrating the flow of electrical current through the device.
Figure 4:
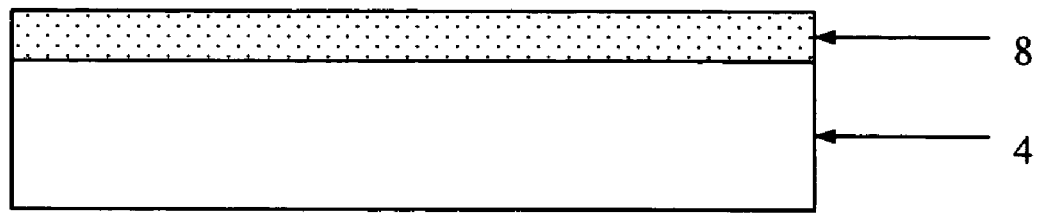
FIGS. 4–12 illustrates a schematic of the process of removing the growth substrate and depositing the secondary substrate as embodied in the invention.

A more efficient, both electrically and thermally, device structure is shown in FIG. 3a. The sapphire substrate has been replaced with an electrically and thermally conductive substrate (7), which allows both electrical current and heat to flow vertically through the device. Since the current now flows vertically from the p-pad (6), through the p-layer (1), the QW layer (2), the n-layer (3), and into the substrate (7), which doubles as the n-pad, this is known as a vertical device structure. An alternate vertical configuration is shown in FIG. 3b.

The choice for substrate (7) is limited if it is to be used as a growth substrate for high quality GaN epitaxy. GaN wafers of sufficient quality, diameter, and thickness are not currently technically feasible. SiC wafers are used to grown GaN epitaxy, but SiC of sufficient quality is very expensive, and generally not commercially viable. However, if sapphire is used for the GaN epitaxy, thereby producing high quality GaN, and then replaced by a conductive substrate, this replacement substrate is no longer required to be compatible with epitaxy growth. This makes the choice of replacement substrate much more flexible.

Figure 1:
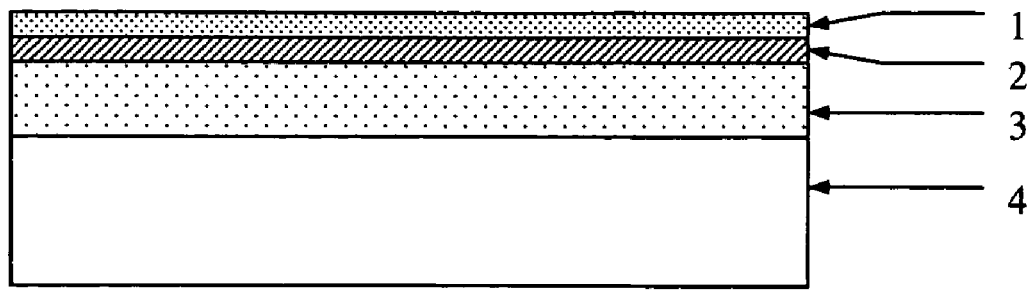
FIG. 1 illustrates a schematic of the GaN epitaxial layers for LED applications.

The process required to replace the sapphire substrate after the epitaxy growth is shown schematically in FIGS. 4–12. First, GaN epitaxial layers described in FIG. 1 are grown on sapphire. For simplicity, layers (1), (2), and (3) of FIG. 1 have been combined into one layer (8) in FIG. 4.

Figure 5:
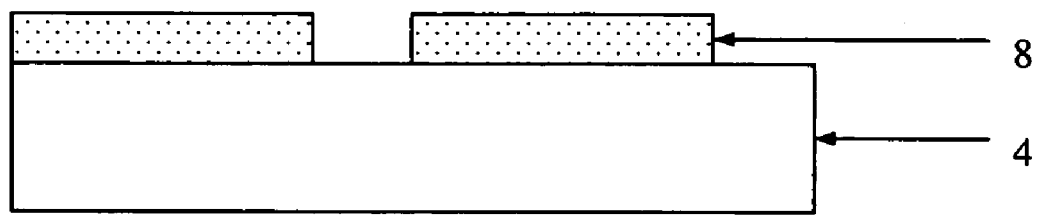

After GaN epitaxy, the GaN layer is patterned through both GaN etching and various deposition (metal, dielectrics) and alloying steps. These steps produce the p-contact of FIG. 3a, and fabricate features that aid in subsequent film delamination and dicing steps. FIG. 5 illustrates two LED structures patterned into GaN Layer (8) on sapphire (4). Depending on the size of each device, each sapphire wafer would contain several thousands of LED devices.

Figure 6:
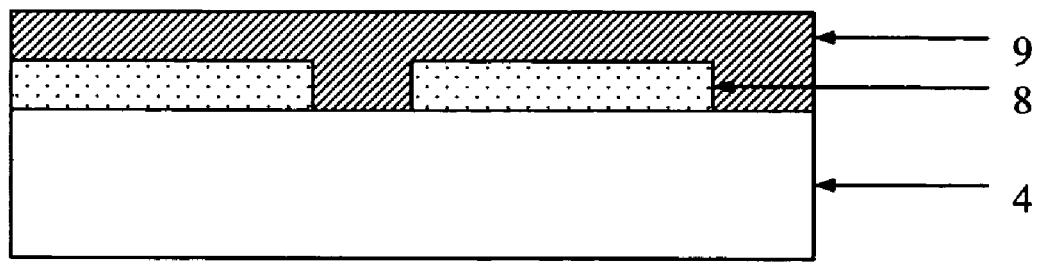

Next, an adhesion layer (9) is deposited on the GaN surface (see FIG. 6). This layer can consist of several different types of material, such as thick photoresists, spin-on glass, epoxies, organic glues, and waxes. For subsequent process flexibility, and for the embodiment of this invention, the adhesion layer should be temporary, and easily removed upon process completion. This requirement makes photoresists, organic glues, and waxes particularly attractive. The preferred method of adhesion layer deposition is spin coating, as this produces a uniform, repeatable, bubble free layer if properly performed.

Figure 7:
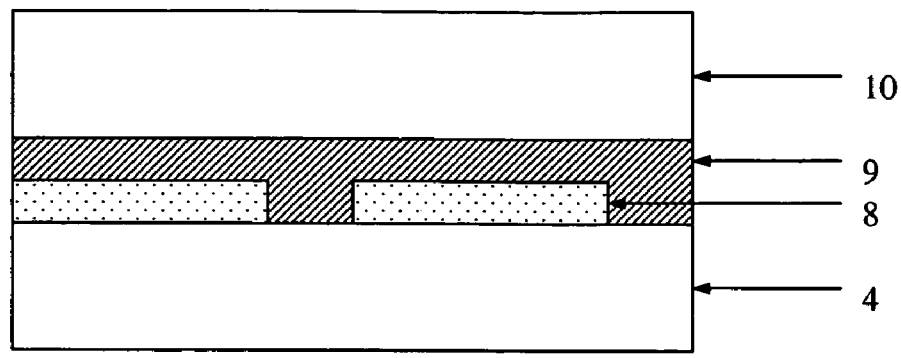

With the appropriate adhesion layer in place, but not yet cured, a support wafer (10) is attached in FIG. 7. This assembly is then cured through a combination of time and temperature, with care being taken to allow for subsequent removal of the support wafer (10). The support wafer needs to be sufficiently stiff to allow handling after removal of the sapphire wafer. Also, researchers at University of California have found that matching the mechanical stiffness of the support wafer to that of the GaN film is useful in reducing damage to the GaN during sapphire removal.

The wafer is then selectively exposed to laser radiation (see FIG. 8) with wavelength energies lower than the bandgap of sapphire (9 eV) but higher than the bandgap of GaN (3.4 eV), which restricts the wavelengths between 138 nm and 364 nm. At these wavelengths, the laser passed through the sapphire with minimal absorption, but is maximally absorbed in the GaN without penetrating significantly into the GaN film. For the embodiment of this invention, a 248 nm KrF excimer laser is used, since these lasers are commercially available with sufficiently high power densities. Beam power densities above >600 mJ/cm$^2$ are required to decompose the GaN into gallium and nitrogen at the GaN-sapphire interface.

Figure 8:
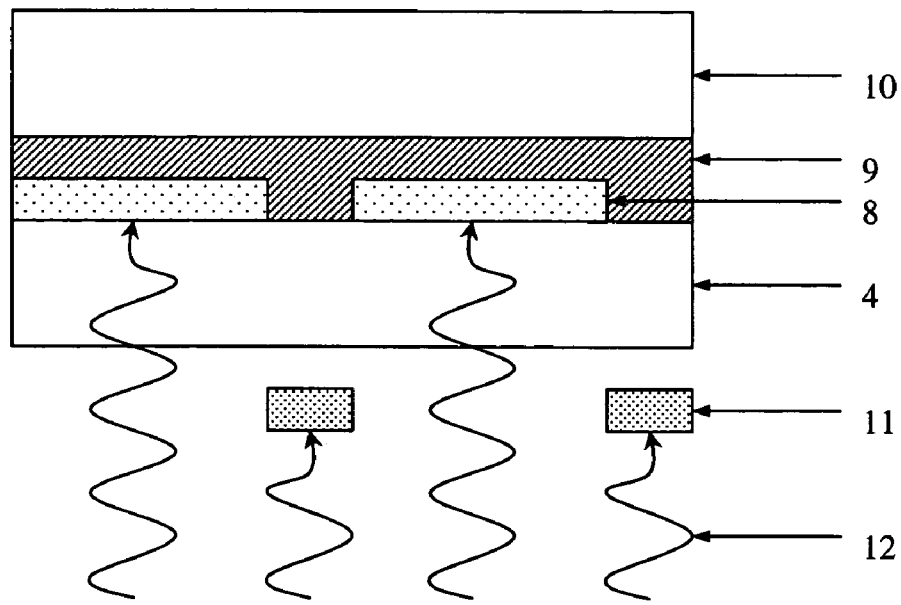

As seen in FIG. 8, a shadow mask (11), carefully aligned to the patterned GaN (8), is used to block the laser beam (12) from hitting areas where the GaN has been removed during earlier processing. This is critical, since exposing the adhesion layer (9) directly to the laser beam can cause the layer to weaken, thereby causing support wafer (10) delamination and GaN film cracking.

Figure 13:
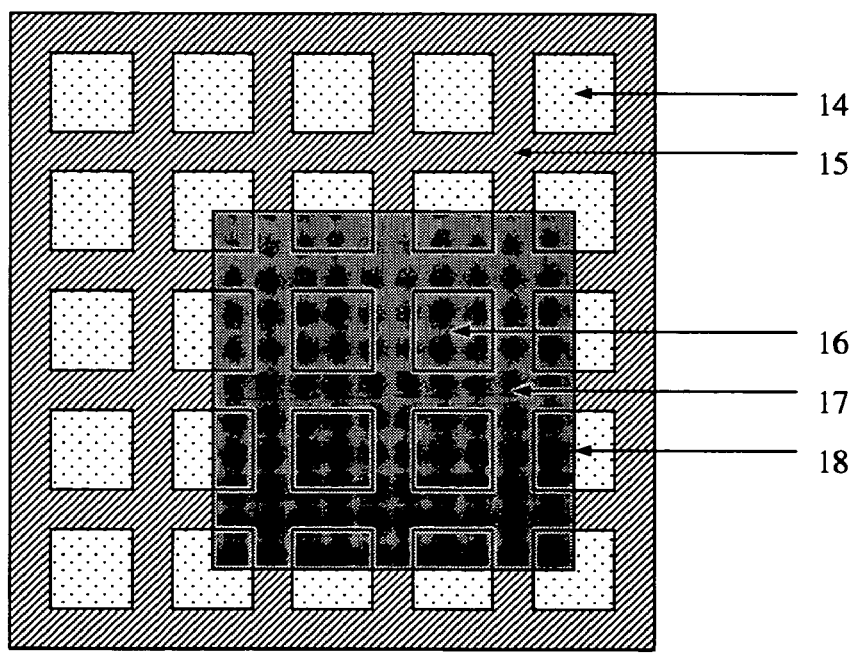
FIG. 13 illustrates a schematic of single laser exposure without the use of shadow mask.

Furthermore, due to limitations of laser energy densities, a maximum area of 2 mm$^2$ can be exposed at one time. Consequently, in order to expose an entire 50 mm diameter wafer (the current state-of the-art in GaN on sapphire), multiple, sequential exposures must be carried out. Although a single exposure can generally result in a relatively crack free delaminated area, large stresses build up at the boundary of the delaminated area, as the delaminated GaN transitions to fully bonded GaN. A second exposure adjacent and contacting a delaminated area will often induce severe cracking in the GaN film. FIG. 13 shows a single, unaligned laser exposure where no shadow mask is used. (14) and (15) represent unexposed GaN device and adhesion layer, respectively. (16) represents fully exposed and delaminated GaN device, while (17) represents exposed, and consequently weakened, adhesion layer. The boundary of exposure, where high stresses are located in the GaN film, is shown by (18).

Figure 14:
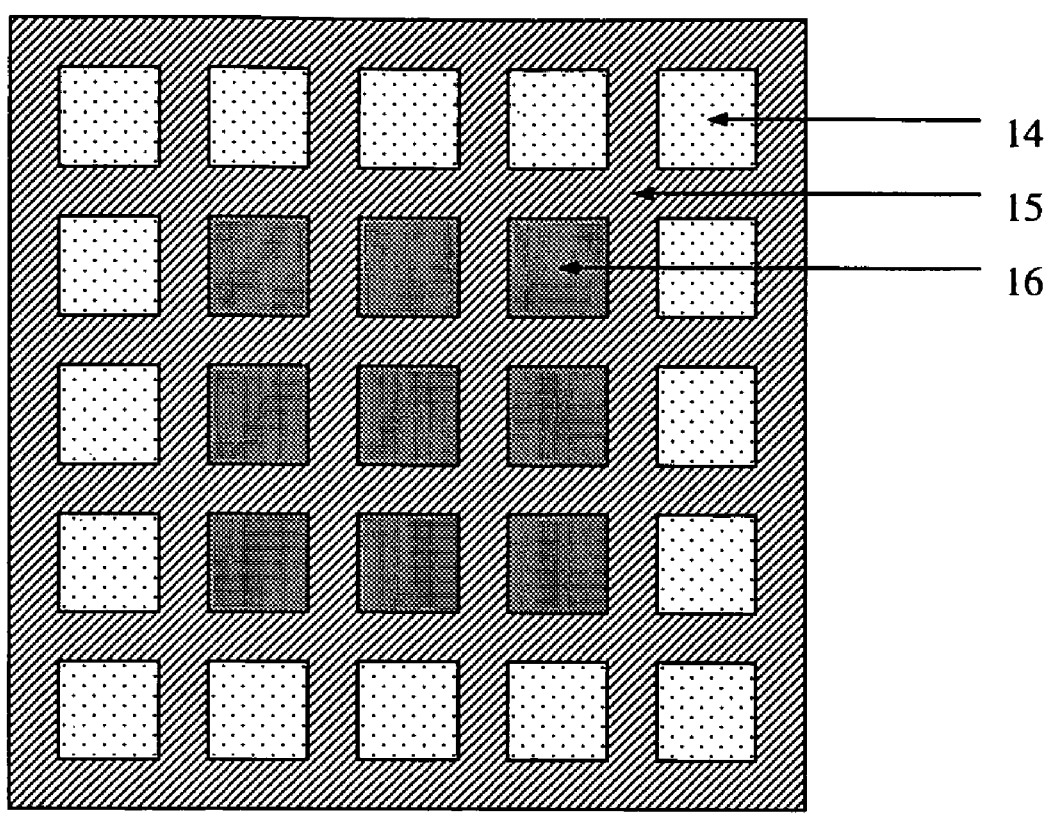
FIG. 14 illustrates a schematic of single laser exposure with the use of shadow mask.

As embodied in this invention, however, selective laser exposure ensures that all GaN devices within an exposure area are fully delaminated, and that the adhesion layer between adjacent GaN dies is not weaken and can absorb the stresses at the exposure boundary. FIG. 14 shows a single laser exposure patterned using a shadow mask. Also shown are unexposed GaN devices (14), unexposed adhesion layer (15), and fully exposed GaN devices (16). In contrast to FIG. 13, there are no partially exposed GaN devices, and no regions of exposed adhesion layer. If necessary, a wide adhesion layer filled trench can be incorporated on the GaN wafer to accommodate the delamination boundary of each laser exposure, further reducing any potential cracking due to stress buildup at these boundaries.

Figure 9:
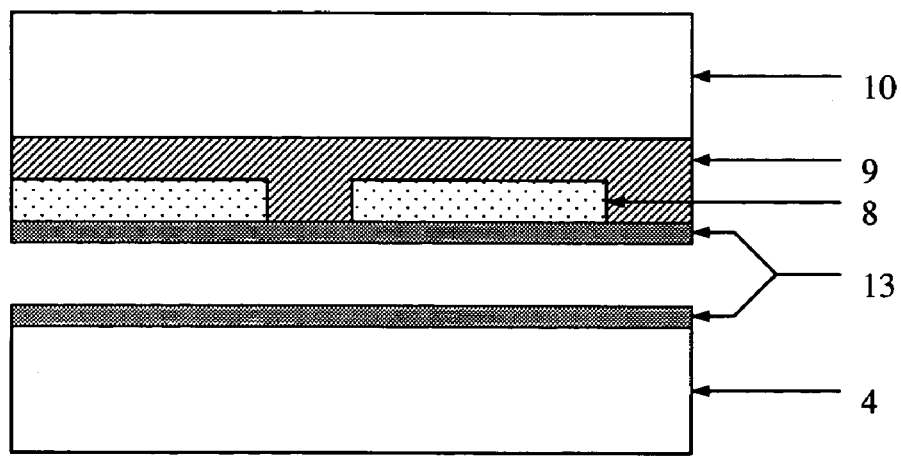
Figure 10:
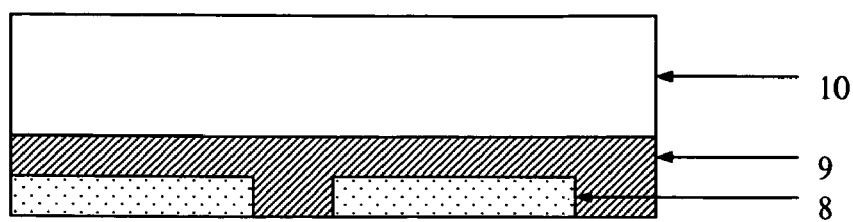

After the entire wafer has been exposed to the laser radiation, the wafer is heated to slightly above 30 C, and the sapphire growth wafer can now be removed. FIG. 9 shows the delaminated sapphire wafer (4) and the GaN layer (8) bonded to the support wafer 10. A thin film of Ga (13) will remain on both newly exposed surfaces after delamination, but this reside can easily be removed with a 10 sec HCl:H$_2$O (1:1) dip. Such a cleaned wafer is shown in FIG. 10.

Figure 11:
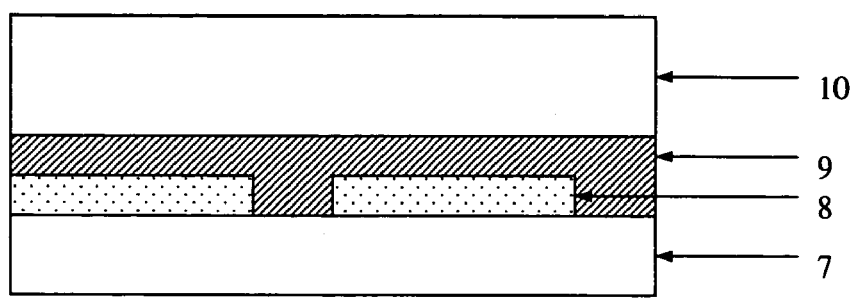

The secondary substrate (7) of FIG. 11 may now be deposited onto the exposed GaN film (8). There are numerous methods of depositing this substrate, as there are numerous substrate materials. The preferred embodiment for this invention is the electron-beam evaporation of a thin contact layer consisting of Ti/Al (50 Å/4000 Å) or Ag (4000 Å), followed by a thin Cr/Au (500 Å/10,000 Å) layer to prevent corrosion of the Ti/Al or Ag. A thick (50–100 um) layer of metal may now be plated onto the wafer. Metal choice depends on the application, but Cu is a good choice for electrical and thermal properties.

Figure 12:
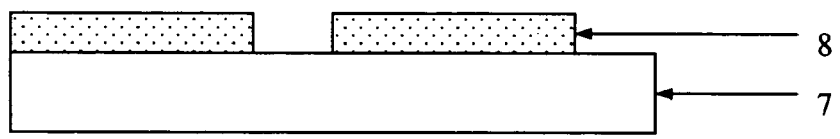

Finally, the support wafer (10) of FIG. 11 may be removed by submersing the wafer in an appropriate solvent, usually acetone, in order to dissolve the adhesion layer (8). The final wafer structure is shown in FIG. 12, before the wafer is diced into individual devices. A more detailed drawing of an individual chip is shown in FIG. 3a, where (7) is the secondary substrate (doubling as the n-pad), (6) is the p-pad, (1) is the p-layer of the epi, (2) is the QW layer of the epi, and (3) is the n-layer of the epi.

An alternate embodiment of the invention is to bond or deposit a permanent support wafer prior to laser delamination, instead of the temporary support wafer described above. This permanent support wafer will be used as a mechanical support, an electrical contact to the epi, and either an optical path for or a reflector of the light emitting from the epi. In this embodiment, the secondary substrate is not needed, but is replaced by a N-type bond pad, usually, but not necessarily composed of a thin contact layer consisting of Ti/Al (50 Å/4000 Å), followed by a Cr/Au (500 Å/15,000 Å) layer to prevent corrosion of the Ti/Al and allow wirebonding. A drawing of an individual chip form in this embodiment is shown in FIG. 3b, where (10) is the support wafer (doubling as the p-pad), (5) is the n-pad, (1) is the p-layer of the epi, (2) is the QW layer of the epi, and (3) is the n-layer of the epi.

In another embodiment, GaN epitaxial films grown for LED applications consist of three main, sequentially grown layers (FIG. 1), each of which can be further subdivide into numerous additional layers. The main layers consist of a moderately conductive p-doped GaN layer (1), a light emitting InGaN quantum well (either single or multiple) layer (2), and a conductive n-doped GaN layer (3). Due to the rectifying nature of the GaN p-n junction, such a GaN film can only conduct electrical current from the p-layer (1), through the quantum well (QW) layer (2), into the n-layer (3), not in the other direction. Light will emit from the QW layer only if sufficient current is passed through it, as described above. Consequently, a GaN LED device requires a contact pad to both the n- and p-layers (1,3) through which to deliver this activating current.

In the conventional GaN on sapphire LED (FIG. 2), some of the GaN must be removed to make contact to the n-layer (3) via the n-pad (5). This is the case because the sapphire (4) is not electrically conductive. The electrical current can now pass from the p-pad (6) into the p-layer (1), through the QW layer (2), through the n-layer (3), into the n-pad (5). Because the current runs laterally through the n-layer (3), this type of structure is called lateral.

In the lateral structure, the current flow is not optimal, and a condition known as current crowding will occur, particularly at higher currents. This will reduce the efficiency of the LED. Also, due to the poor thermal conductivity of the sapphire substrate (4), it is not simple to remove heat from the lateral LED. This will increase the chip temperature during operation, which can reduce stability and device lifetimes.

A more efficient, both electrically and thermally, device structure is shown in FIG. 3a. The sapphire substrate has been replaced with an electrically and thermally conductive substrate (7), which allows both electrical current and heat to flow vertically through the device. Since the current now flows vertically from the p-pad (6), through the p-layer (1), the QW layer (2), the n-layer (3), and into the substrate (7), which doubles as the n-pad, this is known as a vertical device structure.

The choice for substrate (7) is limited if it is to be used as a growth substrate for high quality GaN epitaxy. GaN wafers of sufficient quality, diameter, and thickness are not currently technically feasible. SiC wafers are used to grown GaN epitaxy, but SiC of sufficient quality is very expensive, and generally not commercially viable. However, if sapphire is used for the GaN epitaxy, thereby producing high quality GaN, and then replaced by a conductive substrate, this replacement substrate is no longer required to be compatible with epitaxy growth. This makes the choice of replacement substrate much more flexible.

The process required to replace the sapphire substrate after the epitaxy growth is shown schematically in FIGS. 4–12. First, GaN epitaxial layers described in FIG. 1 are grown on sapphire. For simplicity, layers (1), (2), and (3) of FIG. 1 have been combined into one layer (8) in FIG. 4.

After GaN epitaxy, the GaN layer is patterned through both GaN etching and various deposition (metal, dielectrics) and alloying steps. These steps produce the p-contact of FIG. 3a, and fabricate features that aid in subsequent film delamination and dicing steps and are critical to the embodiment of the invention. FIG. 5 illustrates two LED structures patterned into GaN Layer (8) on sapphire (4). Depending on the size of each device, each sapphire wafer would contain several thousands of LED devices.

Next, an adhesion layer (9) is deposited on the GaN surface (see FIG. 6). This layer can consist of several different types of material, such as thick photoresists, spin-on glass, epoxies, organic glues, and waxes. For subsequent process flexibility, and for the embodiment of this invention, the adhesion layer should be temporary, and easily removed upon process completion. This requirement makes photoresists, organic glues, and waxes particularly attractive. The preferred method of adhesion layer deposition is spin coating, as this produces a uniform, repeatable, bubble free layer if properly performed.

With the appropriate adhesion layer in place, but not yet cured, a support wafer (10) is attached in FIG. 7. This assembly is then cured through a combination of time and temperature, with care being taken to allow for subsequent removal of the support wafer (10). The support wafer needs to be sufficiently stiff to allow handling after removal of the sapphire wafer. Also, researchers at University of California have found that matching the mechanical stiffness of the support wafer to that of the GaN film is useful in reducing damage to the GaN during sapphire removal.

The wafer is then selectively exposed to laser radiation (see FIG. 8) with wavelength energies lower than the bandgap of sapphire (9 eV) but higher than the bandgap of GaN (3.4 eV), which restricts the wavelengths between 138 nm and 364 nm. At these wavelengths, the laser passed through the sapphire with minimal absorption, but is maximally absorbed in the GaN without penetrating significantly into the GaN film. For the embodiment of this invention, a 248 nm KrF excimer laser is used, since these lasers are commercially available with sufficiently high power densities. Beam power densities above >600 mJ/cm$^2$ are required to decompose the GaN into gallium and nitrogen at the GaN-sapphire interface.

As seen in FIG. 8, a shadow mask (11), carefully aligned to the patterned GaN (8), is used to block the laser beam (12) from hitting areas where the GaN has been removed during earlier processing. This is critical to the embodiment of the invention. Most adhesives, particularly those that are temporary and therefore of great interest to this invention, are affected by UV radiation. Consequently, they are sensitive to varying degrees to 248 nm radiation, especially to radiation as powerful as a 600 mJ/cm$^2$ laser pulse. Such exposure can over-cure certain adhesives, such as epoxies and photoresists, leaving them brittle, weaken and susceptible to cracking and delamination. Some temporary adhesives may no longer be removable after this over-curing, thereby making it impossible to remove the support wafer when necessary. Other materials, such as waxes, may soften as temperature increases due to absorption of the laser beam. Again, this causes GaN cracking, and in the extreme case, delamination of the support wafer before laser processing is completed.

Furthermore, due to limitations of laser energy densities, a maximum area of 2 mm$^2$ can be exposed at one time. Consequently, in order to expose an entire 50 mm diameter wafer (the current state-of the-art in GaN on sapphire), multiple, sequential exposures must be carried out. Without precise alignment of these exposures to the wafer and to each other, some adhesion layers will be exposed more than once, exacerbating the adhesion layer degradation described in the previous paragraph.

FIG. 13 shows a single, unaligned laser exposure where no shadow mask is used. Features (14) and (15) represent unexposed GaN device and adhesion layer, respectively. Feature (16) represents a fully exposed and delaminated GaN device, while feature (17) represents exposed, and consequently weakened, adhesion layer. The boundary of exposure, where high stresses are located in the GaN film, is shown by (18). Features such as (17) are unavoidable without use of a shadow mask in conjunction with the exposing laser beam, as described in the invention.

As embodied in this invention, however, selective laser exposure ensures that all GaN devices within an exposure area are fully delaminated, and that the adhesion layer between adjacent GaN dies is not weaken and can absorb the stresses at the exposure boundary. FIG. 14 shows a single laser exposure patterned using a shadow mask. Also shown are an unexposed GaN device (14), unexposed adhesion layer (15), and a fully exposed GaN device (16). In contrast to FIG. 13, there are no regions of exposed adhesion layer. If necessary, a wide adhesion layer filled trench can be incorporated on the GaN wafer to accommodate the delamination boundary of each laser exposure, further reducing any potential cracking due to stress buildup at these boundaries.

After the entire wafer has been exposed to the laser radiation, the wafer is heated to slightly above 30 C, and the sapphire growth wafer can now be removed. FIG. 9 shows the delaminated sapphire wafer (4) and the GaN layer (8) bonded to the support wafer 10. A thin film of Ga (13) will remain on both newly exposed surfaces after delamination, but this reside can easily be removed with a 10 sec HCl:H$_2$O (1:1) dip. Such a cleaned wafer is shown in FIG. 10.

The secondary substrate (7) of FIG. 11 may now be deposited onto the exposed GaN film (8). There are numerous methods of depositing this substrate, as there are numerous substrate materials. Finally, the support wafer (10) of FIG. 11 may be removed by submersing the wafer in an appropriate solvent, usually acetone, in order to dissolve the adhesion layer (8). The final wafer structure is shown in FIG. 12, before the wafer is diced into individual devices.

In another embodiment, GaN epitaxial films grown for LED applications consist of three main, sequentially grown layers (FIG. 1), each of which can be further subdivide into numerous additional layers. The main layers consist of a moderately conductive p-doped GaN layer (1), a light emitting InGaN quantum well (either single or multiple) layer (2), and a conductive n-doped GaN layer (3). Due to the rectifying nature of the GaN p-n junction, such a GaN film can only conduct electrical current from the p-layer (1), through the quantum well (QW) layer (2), into the n-layer (3), not in the other direction. Light will emit from the QW layer only if sufficient current is passed through it, as described above. Consequently, a GaN LED device requires a contact pad to both the n- and p-layers (1,3) through which to deliver this activating current.

In the conventional GaN on sapphire LED (FIG. 2), some of the GaN must be removed to make contact to the n-layer (3) via the n-pad (5). This is the case because the sapphire (4) is not electrically conductive. The electrical current can now pass from the p-pad (6), into the p-layer (1), through the QW layer (2), through the n-layer (3), into the n-pad (5). Because the current runs laterally through the n-layer (3), this type of structure is called lateral.

In the lateral structure, the current flow is not optimal, and a condition known as current crowding will occur, particularly at higher currents. This will reduce the efficiency of the LED. Also, due to the poor thermal conductivity of the sapphire substrate (4), it is not simple to remove heat from the lateral LED. This will increase the chip temperature during operation, which can reduce stability and device lifetimes.

A more efficient, both electrically and thermally, device structure is shown in FIG. 3a. The sapphire substrate has been replaced with an electrically and thermally conductive substrate (7), which allows both electrical current and heat to flow vertically through the device. Since the current now flows vertically from the p-pad (6), through the p-layer (1), the QW layer (2), the n-layer (3), and into the substrate (7), which doubles as the n-pad, this is known as a vertical device structure. An alternate vertical configuration is shown in FIG. 3b.

The choice for substrate (7) is limited if it is to be used as a growth substrate for high quality GaN epitaxy. GaN wafers of sufficient quality, diameter, and thickness are not currently technically feasible. SiC wafers are used to grown GaN epitaxy, but SiC of sufficient quality is very expensive, and generally not commercially viable. However, if sapphire is used for the GaN epitaxy, thereby producing high quality GaN, and then replaced by a conductive substrate, this replacement substrate is no longer required to be compatible with epitaxy growth. This makes the choice of replacement substrate much more flexible.

The process required to replace the sapphire substrate after the epitaxy growth is shown schematically in FIGS. 4–12. First, GaN epitaxial layers described in FIG. 1 are grown on sapphire. For simplicity, layers (1), (2), and (3) of FIG. 1 have been combined into one layer (8) in FIG. 4.

After GaN epitaxy, the GaN layer is patterned through both GaN etching and various deposition (metal, dielectrics) and alloying steps. These steps produce the p-contact of FIG. 3a, and fabricate features that aid in subsequent film delamination and dicing steps. FIG. 5 illustrates two LED structures patterned into GaN Layer (8) on sapphire (4). Depending on the size of each device, each sapphire wafer would contain several thousands of LED devices.

Next, an adhesion layer (9) is deposited on the GaN surface (see FIG. 6). This layer can consist of several different types of material, such as thick photoresists, spin-on glass, epoxies, organic glues, and waxes. For subsequent process flexibility, and for the embodiment of this invention, the adhesion layer should be temporary, and easily removed upon process completion. This requirement makes photoresists, organic glues, and waxes particularly attractive. The preferred method of adhesion layer deposition is spin coating, as this produces a uniform, repeatable, bubble free layer if properly performed.

With the appropriate adhesion layer in place, but not yet cured, a support wafer (10) is attached in FIG. 7. This assembly is then cured through a combination of time and temperature, with care being taken to allow for subsequent removal of the support wafer (1). The support wafer needs to be sufficiently stiff to allow handling after removal of the sapphire wafer. Also, researchers at University of California have found that matching the mechanical stiffness of the support wafer to that of the GaN film is useful in reducing damage to the GaN during sapphire removal.

The wafer is then selectively exposed to laser radiation (see FIG. 8) with wavelength energies lower than the bandgap of sapphire (9 eV) but higher than the bandgap of GaN (3.4 eV), which restricts the wavelengths between 138 nm and 364 nm. At these wavelengths, the laser passed through the sapphire with minimal absorption, but is maximally absorbed in the GaN without penetrating significantly into the GaN film. For the embodiment of this invention, a 248 nm KrF excimer laser is used, since these lasers are commercially available with sufficiently high power densities. Beam power densities above >600 mJ/cm$^2$ are required to decompose the GaN into gallium and nitrogen at the GaN-sapphire interface.

As seen in FIG. 8, a shadow mask (11), carefully aligned to the patterned GaN (8), is used to block the laser beam (12) from hitting areas where the GaN has been removed during earlier processing. This is critical, since exposing the adhesion layer (9) directly to the laser beam can cause the layer to weaken, thereby causing support wafer (10) delamination and GaN film cracking.

Furthermore, due to limitations of laser energy densities, a maximum area of 2 mm$^2$ can be exposed at one time. Consequently, in order to expose an entire 50 mm diameter wafer (the current state-of the-art in GaN on sapphire), multiple, sequential exposures must be carried out. Although a single exposure can generally result in a relatively crack free delaminated area, large stresses build up at the boundary of the delaminated area, as the delaminated GaN transitions to fully bonded GaN. A second exposure adjacent and contacting a delaminated area will often induce severe cracking in the GaN film. FIG. 13 shows a single, unaligned laser exposure where no shadow mask is used. (14) and (15) represent unexposed GaN device and adhesion layer, respectively. (16) represents fully exposed and delaminated GaN device, while (17) represents exposed, and consequently weakened, adhesion layer. The boundary of exposure, where high stresses are located in the GaN film, is shown by (18).

As embodied in this invention, however, selective laser exposure ensures that all GaN devices within an exposure area are fully delaminated, and that the adhesion layer between adjacent GaN dies is not weaken and can absorb the stresses at the exposure boundary. FIG. 14 shows a single laser exposure patterned using a shadow mask. Also shown are unexposed GaN devices (14), unexposed adhesion layer (15), and fully exposed GaN devices (16). In contrast to FIG. 13, there are no partially exposed GaN devices, and no regions of exposed adhesion layer. If necessary, a wide adhesion layer filled trench can be incorporated on the GaN wafer to accommodate the delamination boundary of each laser exposure, further reducing any potential cracking due to stress buildup at these boundaries.

After the entire wafer has been exposed to the laser radiation, the wafer is heated to slightly above 30 C, and the sapphire growth wafer can now be removed. FIG. 9 shows the delaminated sapphire wafer (4) and the GaN layer (8) bonded to the support wafer 10. A thin film of Ga (13) will remain on both newly exposed surfaces after delamination, but this reside can easily be removed with a 10 sec HCl:H$_2$O (1:1) dip. Such a cleaned wafer is shown in FIG. 10.

The secondary substrate (7) of FIG. 11 may now be deposited onto the exposed GaN film (8). There are numerous methods of depositing this substrate, as there are numerous substrate materials. The preferred embodiment for this invention is the electron-beam evaporation of a thin contact layer consisting of Ti/Al (50 Å/4000 Å) or Ag (4000 Å), followed by a thin Cr/Au (500 Å/10,000 Å) layer to prevent corrosion of the Ti/Al or Ag. A thick (50–100 um) layer of metal may now be plated onto the wafer. Metal choice depends on the application, but Cu is a good choice for electrical and thermal properties.

Finally, the support wafer (10) of FIG. 11 may be removed by submersing the wafer in an appropriate solvent, usually acetone, in order to dissolve the adhesion layer (8). The final wafer structure is shown in FIG. 12, before the wafer is diced into individual devices. A more detailed drawing of an individual chip is shown in FIG. 3a, where (7) is the secondary substrate (doubling as the n-pad), (6) is the p-pad, (1) is the p-layer of the epi, (2) is the QW layer of the epi, and (3) is the n-layer of the epi.

An alternate embodiment of the invention is to bond or deposit a permanent support wafer prior to laser delamination, instead of the temporary support wafer described above. This permanent support wafer will be used as a mechanical support, an electrical contact to the epi, and either an optical path for or a reflector of the light emitting from the epi. In this embodiment, the secondary substrate is not needed, but is replaced by a N-type bond pad, usually, but not necessarily composed of a thin contact layer consisting of Ti/Al (50 Å/4000 Å), followed by a Cr/Au (500 Å/15,000 Å) layer to prevent corrosion of the Ti/Al and allow wirebonding. A drawing of an individual chip form in this embodiment is shown in FIG. 3b, where (10) is the support wafer (doubling as the p-pad), (5) is the n-pad, (1) is the p-layer of the epi, (2) is the QW layer of the epi, and (3) is the n-layer of the epi.

In still another embodiment, GaN epitaxial films grown for LED applications consist of three main, sequentially grown layers (FIG. 1), each of which can be further subdivide into numerous additional layers. The main layers consist of a moderately conductive p-doped GaN layer (1), a light emitting InGaN quantum well (either single or multiple) layer (2), and a conductive n-doped GaN layer (3), grown onto a substrate (4), generally sapphire, but necessarily so. Due to the rectifying nature of the GaN p-n junction, such a GaN film can only conduct electrical current from the p-layer (1), through the quantum well (QW) layer (2), into the n-layer (3), not in the other direction. Light will emit from the QW layer only if sufficient current is passed through it, as described above. Consequently, a GaN LED device requires a contact pad to both the n- and p-layers (1, 3) through which to deliver this activating current.

Figure 15:
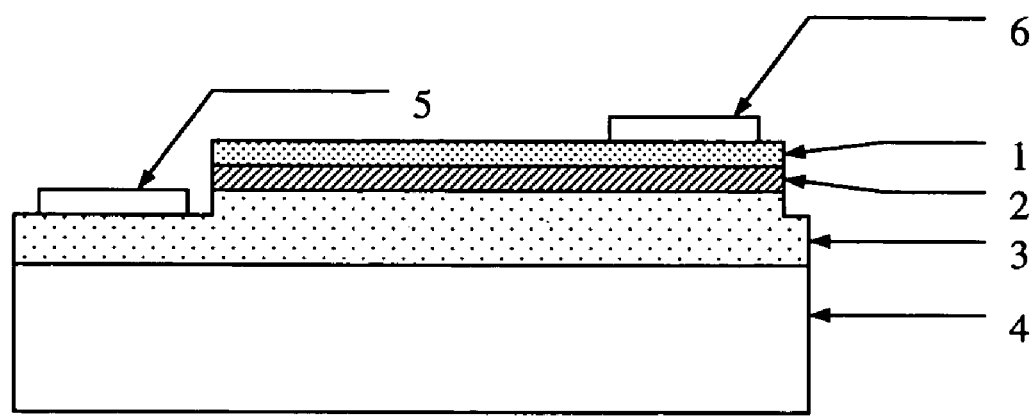
FIG. 15 illustrates a schematic of the conventional lateral blue GaN LED chip.

In the conventional GaN on sapphire LED (FIG. 15), some of the GaN must be removed to make contact to the n-layer (3) via the n-pad (5). This is the case because the sapphire (4) is not electrically conductive. The electrical current can now pass from the p-pad (6), into the p-layer (1), through the QW layer (2), through the n-layer (3), into the n-pad (5). Because the current runs laterally through the n-layer (3), this type of structure is called lateral.

Figure 16:
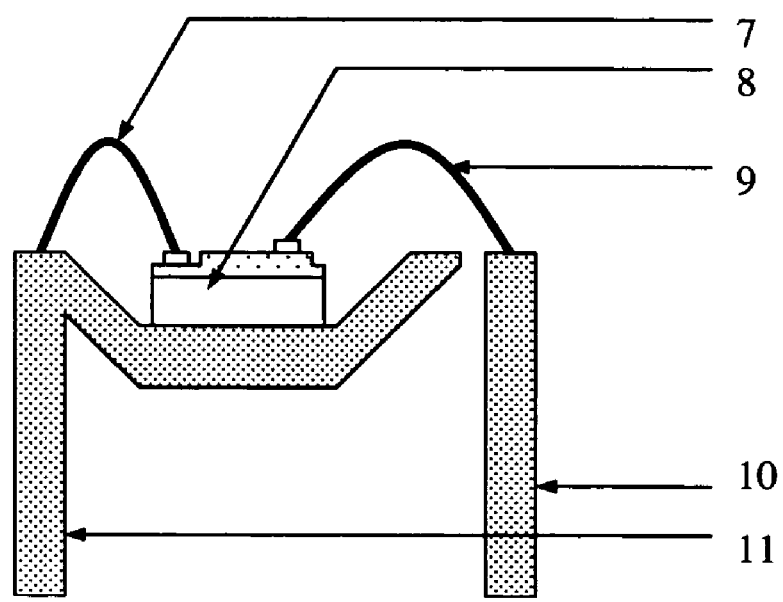
FIG. 16 illustrates a schematic of a lateral blue GaN LED chip after conventional attachment and wire bond to a lead frame.
Figure 17:
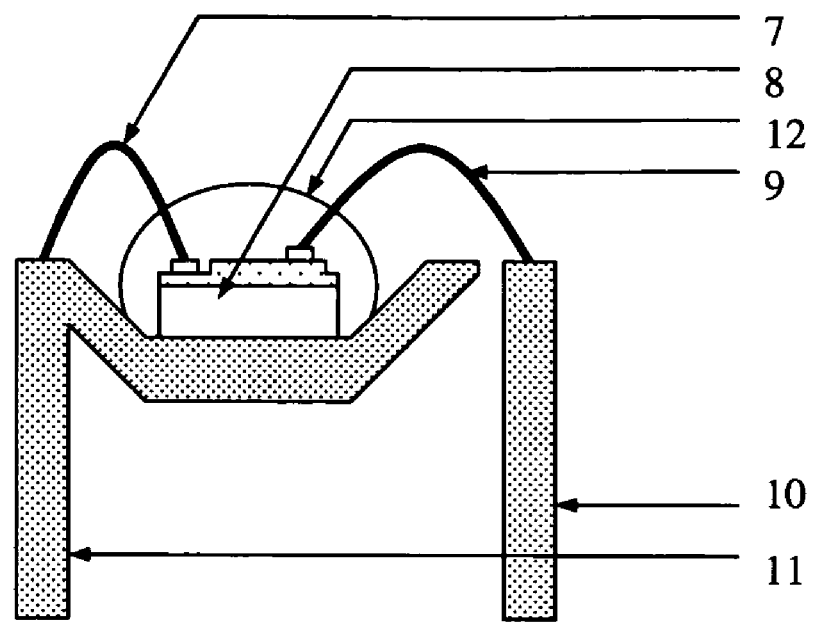
FIG. 17 illustrates a schematic of a partially packaged lateral blue GaN LED chip after conventional deposition of phosphor layer to convert the chip's blue spectrum to white.

FIG. 16 shows a blue lateral GaN LED chip (8) after chip attach and wire bond to a standard lead frame. There are two wire bonds, namely the n wire bond (7) connecting the n-pad to the n-lead (11) and the p wire bond (9) connecting the p-pad to the p-lead (10). In order to create a white LED lamp, the blue GaN chip (8) is coated with a drop of phosphor impregnated epoxy (12), as shown in FIG. 17. In the final packaging step (FIG. 18), the chip (8), wire bonds (7, 9), and phosphor layer (12) are encapsulated in an epoxy lens (13).

Figure 19:
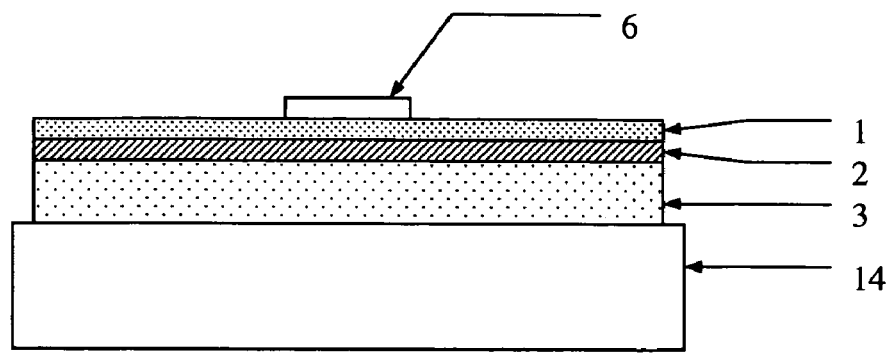
FIG. 19 illustrates a schematic of a vertical blue GaN LED chip.

A more efficient, both electrically and thermally, blue GaN LED structure is shown in FIG. 19. The sapphire substrate has been replaced with an electrically and thermally conductive substrate (14), which allows both electrical current and heat to flow vertically through the device. Since the current now flows vertically from the p-pad (6), through the p-layer (1), the QW layer (2), the n-layer (3), and into the substrate (14), which doubles as the n-pad, this is known as a vertical device structure.

Figure 18:
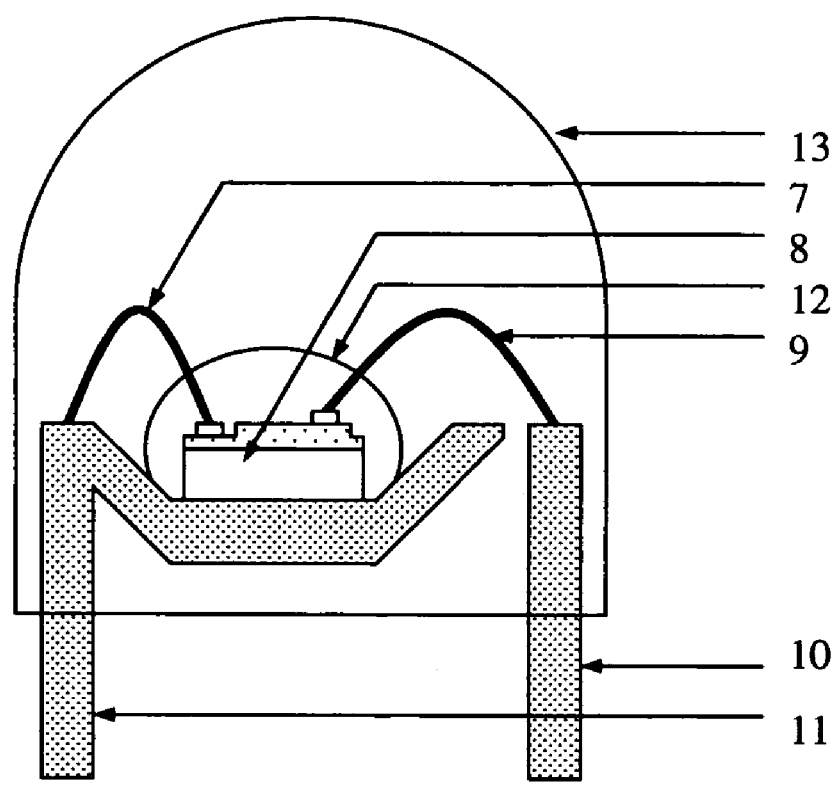
FIG. 18 illustrates a schematic of a completely packaged lateral blue GaN LED demonstrating the conventional white packaging method.
Figure 20:
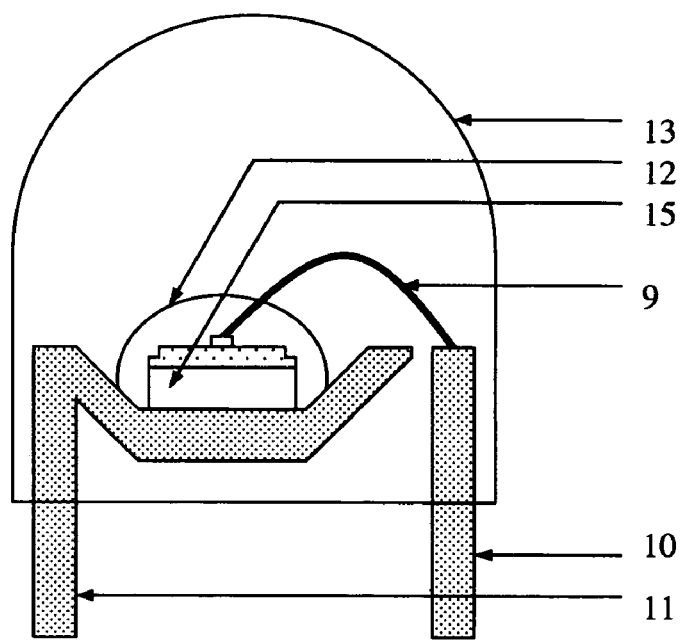
FIG. 20 illustrates a schematic of a completely packaged vertical blue GaN LED demonstrating the conventional white packaging method.

FIG. 20 shows a blue vertical GaN LED chip (15), packaged as a conventional white lamp, in a manner similar to that of the lateral blue LED chip (8) of FIG. 18. Since the chip substrate is now the N-pad, only the p wire bond (9) is required, simplifying packaging somewhat. However, since the chip (15) is blue, the phosphor layer (12) is still necessary.

Figure 21A:
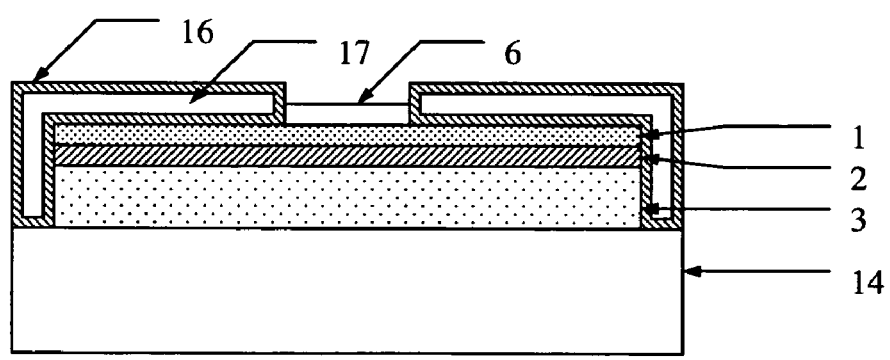
FIG. 21a illustrates a schematic of a vertical white GaN LED chip, as embodied in the invention.
Figure 22:
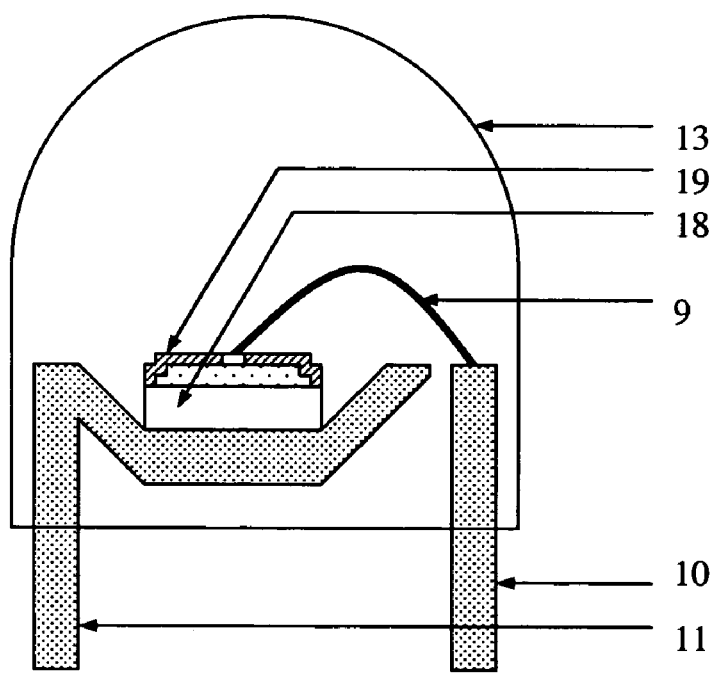
FIG. 22 illustrates a schematic of a completely packaged vertical white GaN LED, as embodied in the invention.
Figure 23:
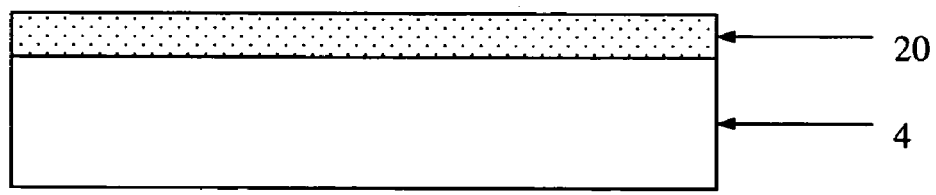
FIGS. 23–33 illustrate a schematic of the process of a vertical white GaN LED chip, as embodied in the invention.

FIG. 21a shows a white vertical GaN LED chip as embodied in the invention. All layers are identical to those of FIG. 19, except for the addition of the phosphor layer (17), and the passivation layer (16). The passivation layer isolates the phosphor from both the GaN chip, and the ambient environment. FIG. 22 shows the white vertical chip (18) packaged as a white lamp as embodied in the invention. No phosphor layers are introduced during the packaging process, since this layer already exists on the chip.

The process required to fabricate the white GaN LED chip is shown schematically in FIGS. 23–33. First, GaN epitaxial layers described in FIG. 1 are grown on sapphire. For simplicity, layers (1), (2), and (3) of FIG. 1 have been combined into one layer (20) in FIG. 23.

Figure 24:
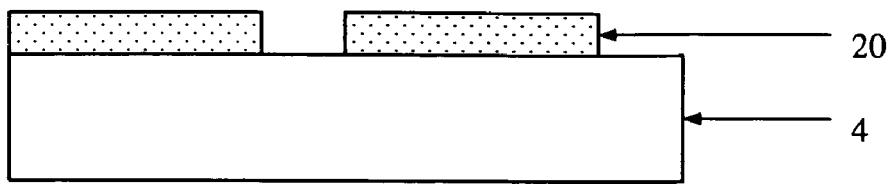

After GaN epitaxy, the GaN layer is patterned through both GaN etching and various depositions (metal, dielectrics) and alloying steps. These steps produce the p-contact of FIG. 19, and fabricate features that aid in subsequent film delamination and dicing steps. FIG. 24 illustrates two LED structures patterned into GaN Layer (20) on sapphire (4). Depending on the size of each device, each sapphire wafer would contain several thousands of LED devices.

Figure 25:
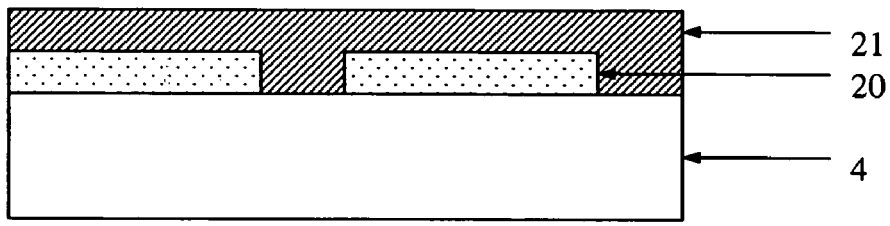

Next, an adhesion layer (21) is deposited on the GaN surface (see FIG. 25). This layer can consist of several different types of material, such as thick photoresists, spin-on glass, epoxies, organic glues, and waxes. For subsequent process flexibility, the adhesion layer should be temporary, and easily removed upon process completion. This requirement makes photoresists, organic glues, and waxes particularly attractive. The preferred method of adhesion layer deposition is spin coating, as this produces a uniform, repeatable, bubble free layer if properly performed.

Figure 26:
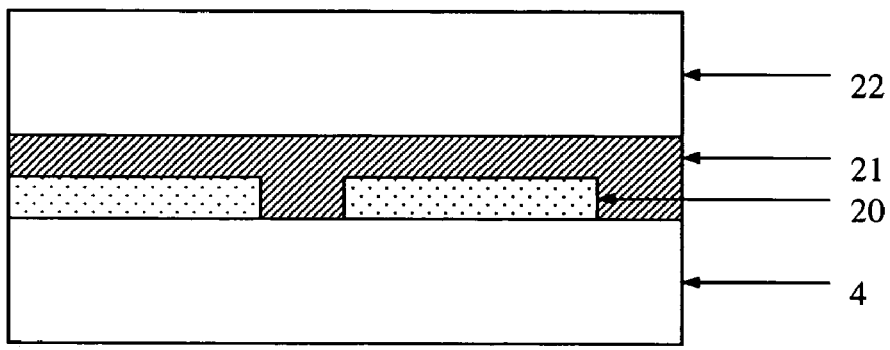

With the appropriate adhesion layer in place, but not yet cured, a support wafer (22) is attached in FIG. 26. This assembly is then cured through a combination of time and temperature, with care being taken to allow for subsequent removal of the support wafer. The support wafer needs to be sufficiently stiff to allow handling after removal of the sapphire wafer. Also, researchers at University of California have found that matching the mechanical stiffness of the support wafer to that of the GaN film is useful in reducing damage to the GaN during sapphire removal.

Figure 27:
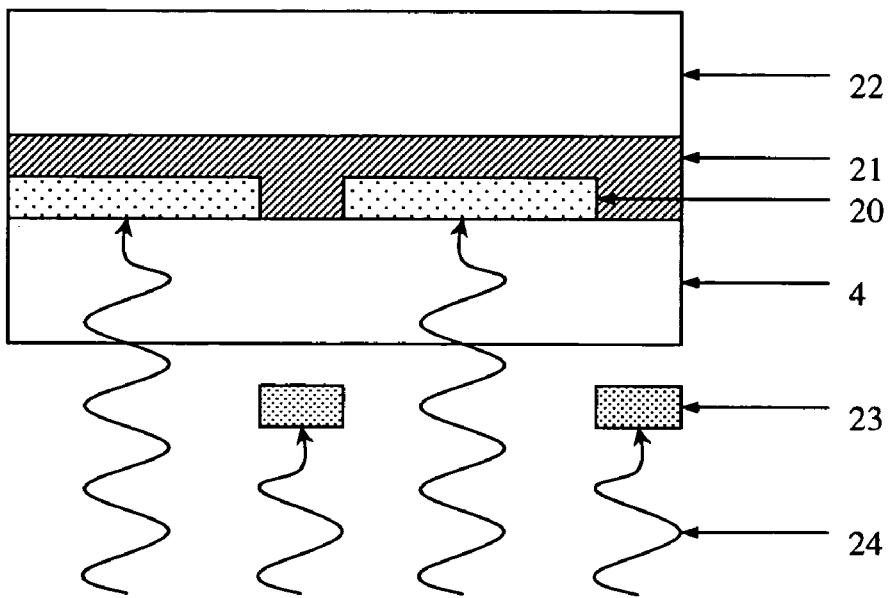

The wafer is then selectively exposed to laser radiation (see FIG. 27) with wavelength energies lower than the bandgap of sapphire (9 eV) but higher than the bandgap of GaN (3.4 eV), which restricts the wavelengths between 138 nm and 364 nm. At these wavelengths, the laser passed through the sapphire with minimal absorption, but is maximally absorbed in the GaN without penetrating significantly into the GaN film. For the embodiment of this invention, a 248 nm KrF excimer laser is used, since these lasers are commercially available with sufficiently high power densities. Beam power densities above >600 mJ/cm$^2$ are required to decompose the GaN into gallium and nitrogen at the GaN-sapphire interface As seen in FIG. 27, a shadow mask (23), carefully aligned to the patterned GaN (20), is used to block the laser beam (24) from hitting areas where the GaN has been removed during earlier processing. This is critical, since exposing the adhesion layer (21) directly to the laser beam can cause the layer to weaken, thereby causing support wafer (22) delamination and GaN film cracking.

Figure 28:
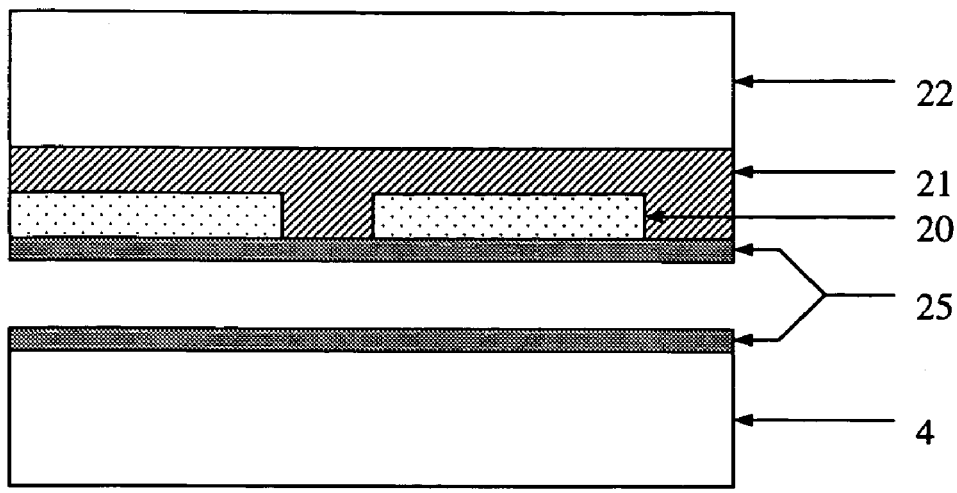
Figure 29:
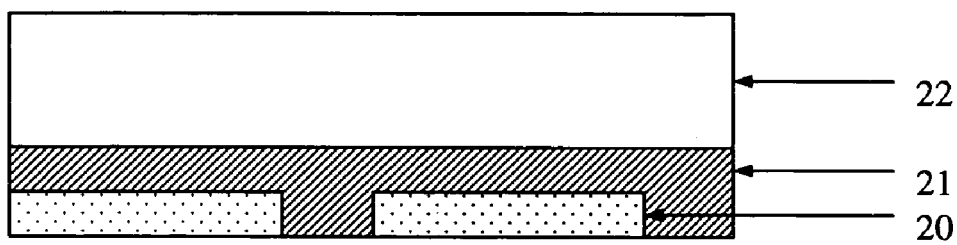

After the entire wafer has been exposed to the laser radiation, the wafer is heated to slightly above 30 C, and the sapphire growth wafer can now be removed. FIG. 28 shows the delaminated sapphire wafer (4) and the GaN layer (20) bonded to the support wafer 22. A thin film of Ga (25) will remain on both newly exposed surfaces after delamination, but this reside can easily be removed with a 10 sec HCl:H$_2$O (1:1) dip. Such a cleaned wafer is shown in FIG. 29.

Figure 30:
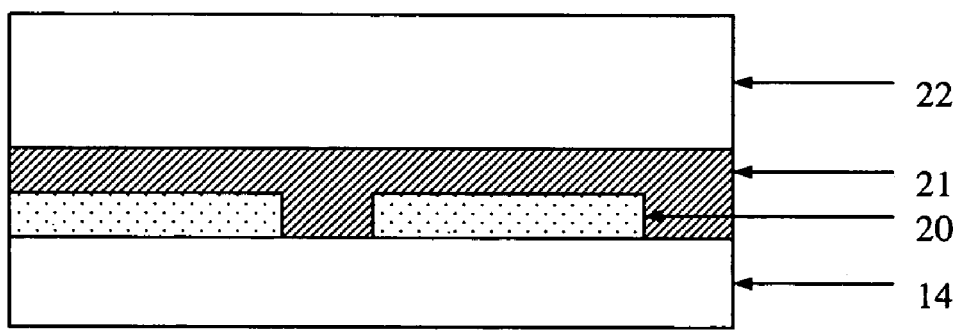

The secondary substrate (14) of FIG. 30 may now be deposited onto the exposed GaN film (20). There are numerous methods of depositing this substrate, as there are numerous substrate materials. A sample process is the electron-beam evaporation of a thin contact layer consisting of Ti/Al (50 Å/4000 Å), followed by a thin Cr/Au (500 Å/10,000 Å) layer to prevent corrosion of the Ti/Al. A thick (50–100 um) layer of metal may now be plated onto the wafer. Metal choice depends on the application, but Cu is a good choice for electrical and thermal properties.

Figure 31:
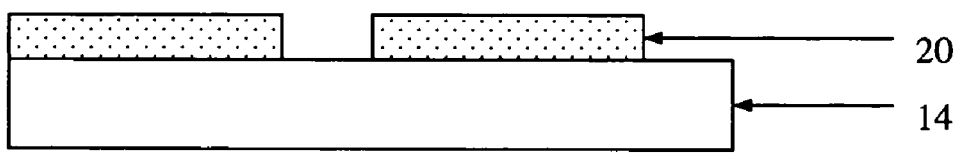
Figure 32:
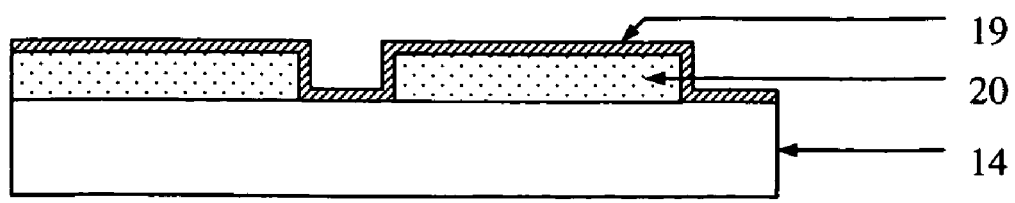
Figure 33:
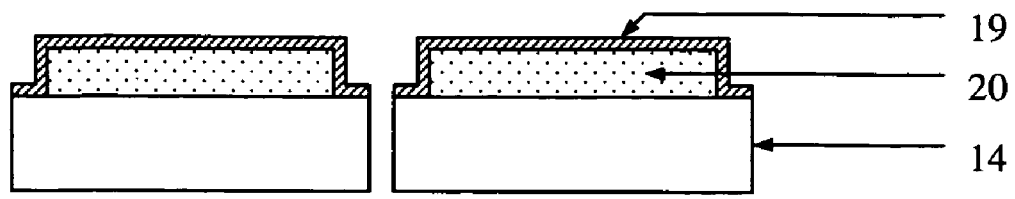

Finally, the support wafer (22) of FIG. 30 may be removed by submersing the wafer in an appropriate solvent, usually acetone, in order to dissolve the adhesion layer (21). The resulting wafer structure is shown in FIG. 31. At this point, each LED chip on the wafer may be electrically and optically probed. An important parameter to measure is the peak wavelength of each device, since the average wavelength of the wafer will determined the subsequent phosphor layer composition and thickness.

Next, as embodied in the invention, the passivation-phosphor-passivation layers (16,17) described in FIG. 21 a are deposited. For simplicity, these layers have been combined into a single layer (19) of FIG. 32. Both the passivation and the phosphor are deposited by low temperature plasma enhanced chemical vapor deposition (PECVD). An alternate embodiment of the invention includes depositing the passivation-phosphor-passivation layers earlier in the wafer process, before laser lift off and substrate transfer, in the steps described in FIG. 24. The benefit of earlier deposition is that higher deposition temperatures may be used, potentially improving the layer quality. A benefit of later deposition, as described earlier, is that the wafer may be probed prior to phosphor deposition, allowing for more accurate phosphor matching.

After the phosphor layer has been deposited and patterned to allow access to the p-pad (6) of FIG. 21a (p-pad not shown in FIGS. 23–33), the wafer may be probed again, this time to measure the white spectrum of each chip. After probing, the wafer is diced, resulting in the separated chips of FIG. 33. The chips are now ready for packaging, as described in FIG. 22.

Figure 21B:
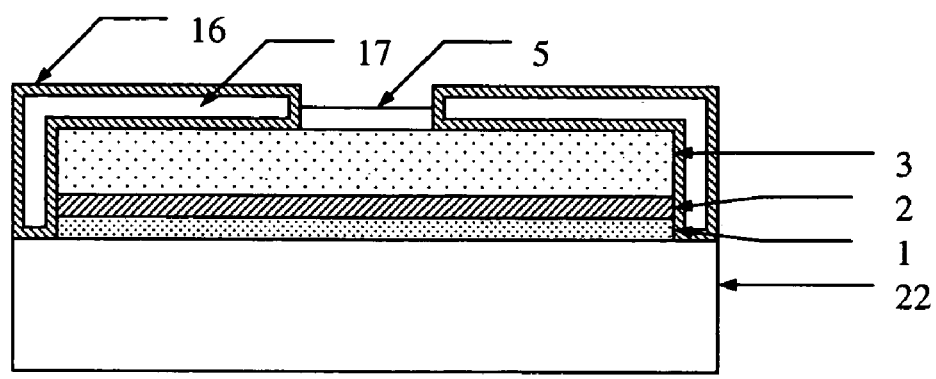
FIG. 21b illustrates a schematic of a vertical white GaN LED chip, as an alternate embodiment of the invention.

An alternate embodiment of the invention is to bond or deposit a permanent support wafer prior to laser delamination, instead of the temporary support wafer described above. This permanent support wafer will be used as a mechanical support, an electrical contact to the epi, and either an optical path for or a reflector of the light emitting from the epi. In this embodiment, the secondary substrate is not needed, but is replaced by a N-type bond pad, usually, but not necessarily composed of a thin contact layer consisting of Ti/Al (50 Å/4000 Å), followed by a Cr/Au (500 Å/15,000 Å) layer to prevent corrosion of the Ti/Al and allow wirebonding. A drawing of an individual chip form in this embodiment is shown in FIG. 21b, where (22) is the support wafer (doubling as the p-pad), (5) is the n-pad, (1) is the p-layer of the epi, (2) is the QW layer of the epi, (3) is the n-layer of the epi, (17) is the phosphor layer, and (16) is the passivation layer.

In a further embodiment, GaN epitaxial films grown for LED applications consist of three main, sequentially grown layers (FIG. 1), each of which can be further subdivide into numerous additional layers. The main layers consist of a moderately conductive p-doped GaN layer (1), a light emitting InGaN quantum well (either single or multiple) layer (2), and a conductive n-doped GaN layer (3). Due to the rectifying nature of the GaN p-n junction, such a GaN film can only conduct electrical current from the p-layer (1), through the quantum well (QW) layer (2), into the n-layer (3), not in the other direction. Light will emit from the QW layer only if sufficient current is passed through it, as described above. Consequently, a GaN LED device requires a contact pad to both the n- and p-layers (1,3) through which to deliver this activating current.

In the conventional GaN on sapphire LED (FIG. 2), some of the GaN must be removed to make contact to the n-layer (3) via the n-pad (5). This is the case because the sapphire (4) is not electrically conductive. The electrical current can now pass from the p-pad (6), into the p-layer (1), through the QW layer (2), through the n-layer (3), into the n-pad (5). Because the current runs laterally through the n-layer (3), this type of structure is called lateral.

In the lateral structure, the current flow is not optimal, and a condition known as current crowding will occur, particularly at higher currents. This will reduce the efficiency of the LED. Also, due to the poor thermal conductivity of the sapphire substrate (4), it is not simple to remove heat from the lateral LED. This will increase the chip temperature during operation, which can reduce stability and device lifetimes.

A more efficient, both electrically arid thermally, device structure is shown in FIG. 3a. The sapphire substrate has been replaced with an electrically and thermally conductive substrate (7), which allows both electrical current and heat to flow vertically through the device. Since the current now flows vertically from the p-pad (6), through the p-layer (1), the QW layer (2), the n-layer (3), and into the substrate (7), which doubles as the n-pad, this is known as a vertical device structure.

The choice for substrate (7) is limited if it is to be used as a growth substrate for high quality GaN epitaxy. GaN wafers of sufficient quality, diameter, and thickness are not currently technically feasible. SiC wafers are used to grown GaN epitaxy, but SiC of sufficient quality is very expensive, and generally not commercially viable. However, if sapphire is used for the GaN epitaxy, thereby producing high quality GaN, and then replaced by a conductive substrate, this replacement substrate is no longer required to be compatible with epitaxy growth. This makes the choice of replacement substrate much more flexible.

The process required to replace the sapphire substrate after the epitaxy growth is shown schematically in FIGS. 4–7 and 34–38. First, GaN epitaxial layers described in FIG. 1 are grown on sapphire. For simplicity, layers (1), (2), and (3) of FIG. 1 have been combined into one layer (8) in FIG. 4.

After GaN epitaxy, the GaN layer is patterned through both GaN etching and various deposition (metal, dielectrics) and alloying steps. These steps produce the p-contact of FIG. 3a, and fabricate features that aid in subsequent film delamination and dicing steps. FIG. 5 illustrates two LED structures patterned into GaN Layer (8) on sapphire (4). Depending on the size of each device, each sapphire wafer would contain several thousands of LED devices.

Next, an adhesion layer (9) is deposited on the GaN surface (see FIG. 6). This layer can consist of several different types of material, such as thick photoresists, spin-on glass, epoxies, organic glues, and waxes. For subsequent process flexibility, and for the embodiment of this invention, the adhesion layer should be temporary, and easily removed upon process completion. This requirement makes photoresists, organic glues, and waxes particularly attractive. The preferred method of adhesion layer deposition is spin coating, as this produces a uniform, repeatable, bubble free layer if properly performed.

With the appropriate adhesion layer in place, but not yet cured, a support wafer (10) is attached in FIG. 7. This assembly is then cured through a combination of time and temperature, with care being taken to allow for subsequent removal of the support wafer (1). The support wafer needs to be sufficiently stiff to allow handling after removal of the sapphire wafer. Also, researchers at University of California have found that matching the mechanical stiffness of the support wafer to that of the GaN film is useful in reducing damage to the GaN during sapphire removal.

Figure 34:
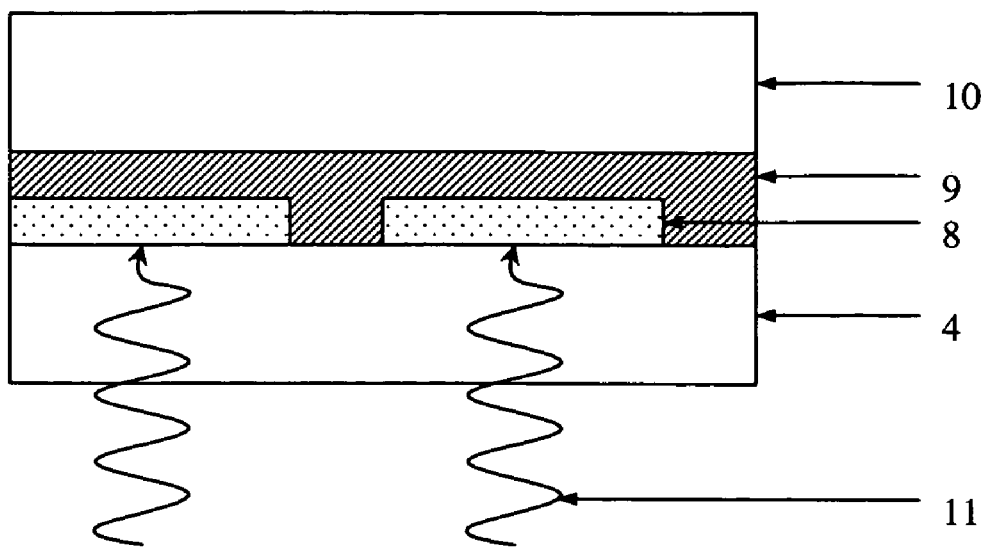
FIGS. 34–38 illustrate a schematic of the process of removing the growth substrate and depositing the secondary substrate as embodied in the invention.

In FIG. 34 the wafer is then exposed to laser radiation (11) with wavelength energies lower than the bandgap of sapphire (9 eV) but higher than the bandgap of GaN (3.4 eV), which restricts the wavelengths between 138 nm and 364 nm. At these wavelengths, the laser passed through the sapphire with minimal absorption, but is maximally absorbed in the GaN without penetrating significantly into the GaN film. For the embodiment of this invention, a 248 nm KrF excimer laser is used, since these lasers are commercially available with sufficiently high power densities. Beam power densities above >600 mJ/cm$^2$ are required to decompose the GaN into gallium and nitrogen at the GaN-sapphire interface.

Figure 35:
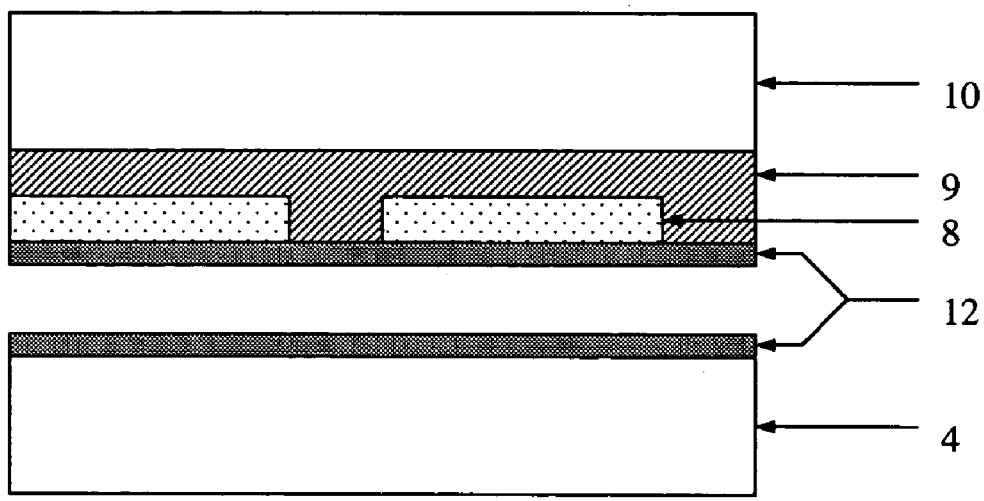
Figure 36:
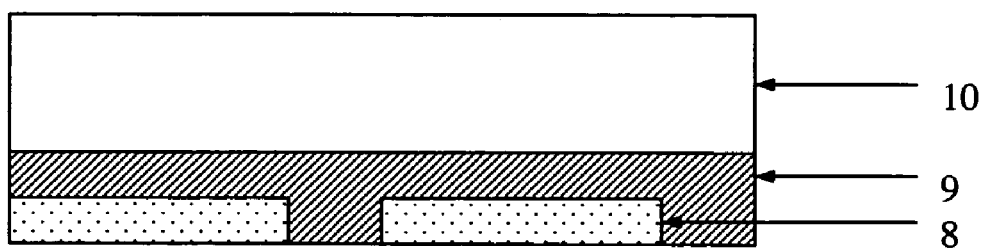
Figure 37:
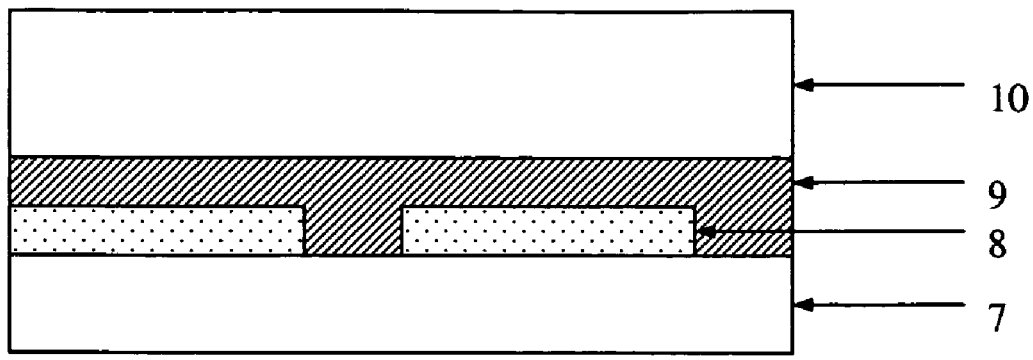

After the entire wafer has been exposed to the laser radiation, the wafer is heated to slightly above 30 C, and the sapphire growth wafer can now be removed. FIG. 35 shows the delaminated sapphire wafer (4) and the GaN layer (8) bonded to the support wafer (10). A thin film of Ga (12) will remain on both newly exposed surfaces after delamination, but this reside can easily be removed with a 10 sec HCl:H$_2$O (1:1) dip. Such a cleaned wafer is shown in FIG. 36.

The secondary substrate (7) of FIG. 11 (and FIG. 3) may now be deposited onto the exposed GaN film (8). Finally, the support wafer (10) of FIG. 37 may be removed by submersing the wafer in an appropriate solvent, usually acetone, in order to dissolve the adhesion layer (9). The final wafer structure is shown in FIG. 38, before the wafer is diced into individual devices.

Figure 38:
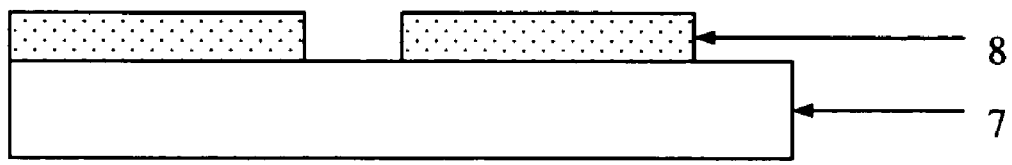

A more detailed view of the secondary substrate is shown in FIG. 38. There are numerous methods of depositing this substrate, as there are numerous substrate materials. The preferred embodiment for this invention is the electron-beam evaporation of a thin contact layer consisting of 40 Å ($4.0\times10^{-6}$ mm) of titanium (13) and 40 Å ($4.0\times10^{-6}$ mm) of aluminum (14), the purpose of which is to make a good ohmic contact to the n-dope portion of the GaN layer (8), while still remaining thin enough to be optically transparent. FIGS. 1 and 3 show this n-doped layer (3) more clearly.

The next layer (15) consist of approximately 2000 Å ($2.0\times10^{-4}$ mm) of silver. This layer needs to be thick enough to act as a good reflector for the spectrum produced by the GaN QW layer. While other metals can be use (e.g. aluminum), silver is one of the best metallic reflectors available.

The next two layers consists of 2000 Å ($2.0\times10^{-4}$ mm) of chromium (16), followed by 5000 Å ($5.0\times10^{-4}$ mm) of gold (17). The chromium acts as a barrier, preventing the gold from migrating into layers (13), (14), and (15). The gold prevents corrosion of these same layers during subsequent process steps.

The bulk substrate layer (18) may now be deposited onto the wafer, either by evaporation, sputtering, plating, or other means. This layer should be reasonably thick (50–100 um, or 0.05 to 0.1 mm) in order to provide some mechanical strength to the wafer. This layer should be a good thermal and electrical conductor. Finally, the layer should be mechanically rigid enough to allow dicing or other methods of separating the wafer into individual chips. The optical properties of this layer are not relevant, since layers (13), (14), (15) do all the optical processing.

If desired, depending on the choice of bulk layer (18), another set of chromium (19) and gold layers (20) may be deposited on top of the bulk layer for corrosion protection. Also, the gold layer (20) may make subsequent chip attach processes simpler and more robust.

Figure 39:
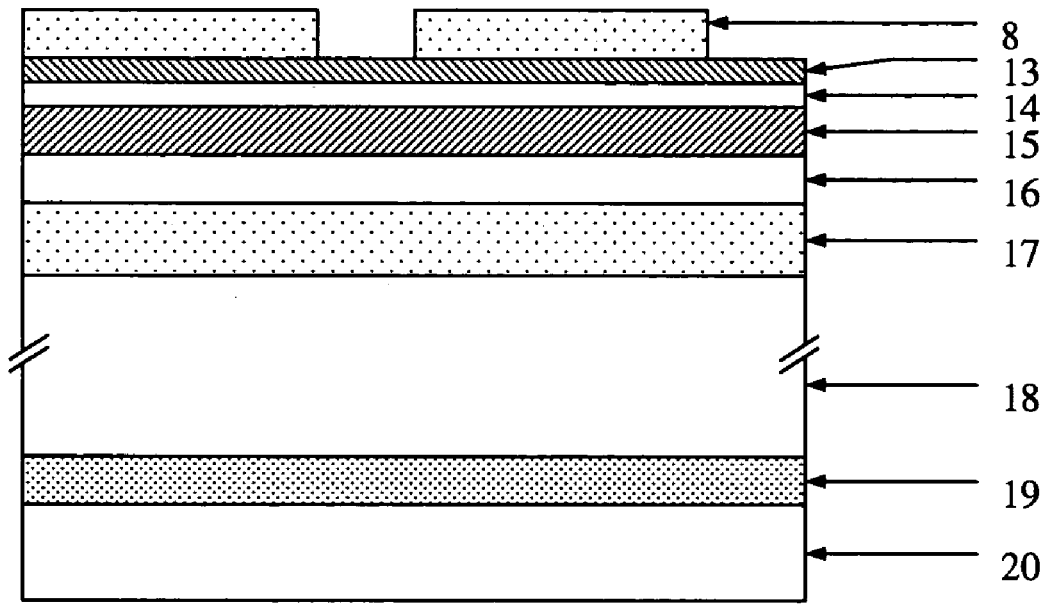
FIG. 39 illustrates a detailed schematic of the secondary substrate not using a DBR, as embodied in the invention.
Figure 40:
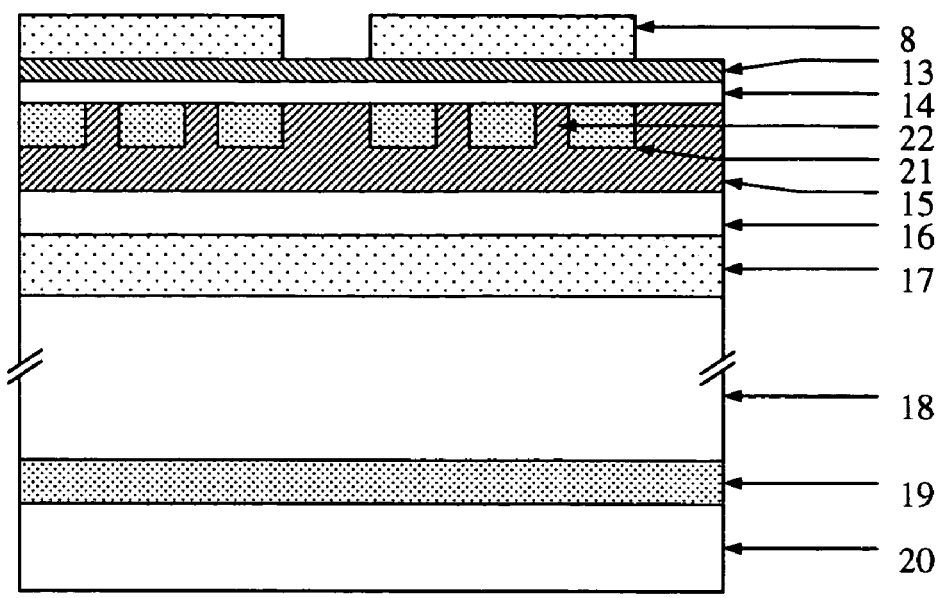
FIG. 40 illustrates a detailed schematic of the secondary substrate using a DBR, as embodied in the invention.

An alternate secondary substrate structure, also embodied in this invention, is shown in FIG. 40. It is substantially similar to that described above in FIG. 39, with the addition of layer (21) between layers (14) and (15). Layer (21) consists of a Dielectric Bragg Reflector (DBR), which can be tuned to provide a significantly better coefficient of reflection for the desired wavelength than the simple silver layer (15) alone. However, the DBR layer is not electrically conductive, and openings (22) must be patterned into this layer to allow electrical contact between layer (14) and (15).

While a particular embodiment of the present invention has been shown and described, it will be obvious to those skilled in the art that changes and modifications may be made without departing from the spirit of the present invention, and therefore the appended claims are to include these changes and alterations as follow within the true spirit and scope of the present invention.

What is claimed is:

1. A method of processing GaN comprising:
   (a) growing a GaN epitaxial layer on a top surface of a sapphire substrate;
   (b) patterning said GaN layer;
   (c) attaching a support structure to said GaN layer;
   (d) radiating with a laser directed at a bottom surface of said sapphire substrate, wherein a wavelength of said laser is selected to cause energy of said laser to be substantially absorbed near an interface of said GaN layer with said sapphire so as to delaminate said GaN and create an exposed GaN surface;
   (e) removing said sapphire substrate;
   (f) depositing a secondary substrate onto said exposed GaN surface, wherein said secondary substrate includes:
      (i) a first contact layer selected from the group consisting of Ti/Al and Ag;
      (ii) a second layer of Cr/Au on said first layer; and
      (iii) a third layer of metal on said second layer.

2. A method as recited in claim 1 wherein said support structure includes:
   (a) a first adhesive layer on said GaN; and
   (b) a second support layer on said first layer.

* * * * *